US010209335B2

(12) United States Patent
Griswold et al.

(10) Patent No.: US 10,209,335 B2
(45) Date of Patent: Feb. 19, 2019

(54) NUCLEAR MAGNETIC RESONANCE (NMR) FINGERPRINTING WITH SINGULAR VALUE DECOMPOSITION (SVD) COMPRESSION

(71) Applicant: Case Western Reserve University, Cleveland, OH (US)

(72) Inventors: Mark Griswold, Shaker Heights, OH (US); Debra McGivney, Rocky River, OH (US); Dan Ma, Cleveland, OH (US)

(73) Assignee: Case Western Reserve University, Cleveland, OH (US)

( * ) Notice: Subject to any disclaimer, the term of this patent is extended or adjusted under 35 U.S.C. 154(b) by 1328 days.

(21) Appl. No.: 14/257,348

(22) Filed: Apr. 21, 2014

(65) Prior Publication Data
US 2015/0302579 A1    Oct. 22, 2015

(51) Int. Cl.
G06T 7/00       (2017.01)
G01R 33/34      (2006.01)
H04N 19/85      (2014.01)
G06T 5/00       (2006.01)
G06K 9/62       (2006.01)
G01R 33/56      (2006.01)
G01R 33/48      (2006.01)
G06K 9/00       (2006.01)
H04N 19/90      (2014.01)
G01R 33/44      (2006.01)

(52) U.S. Cl.
CPC ..... *G01R 33/5608* (2013.01); *G06K 9/00543* (2013.01); *H04N 19/85* (2014.11); *G01R 33/448* (2013.01); *G06K 9/624* (2013.01); *H04N 19/90* (2014.11)

(58) Field of Classification Search
CPC .. G01R 33/448; G01R 33/4828; G01R 33/50; G01R 33/5608; G06K 9/00543; G06K 9/624; H04N 19/85; H04N 19/90
See application file for complete search history.

(56) References Cited

U.S. PATENT DOCUMENTS

2012/0235678 A1\* 9/2012 Seiberlich .............. G01R 33/56
324/307
2015/0346301 A1\* 12/2015 Cauley ................... G01R 33/50
324/309

OTHER PUBLICATIONS

Ma, Dan, et al. "Magnetic resonance fingerprinting." Nature 495. 7440 (2013): 187.\*

\* cited by examiner

*Primary Examiner* — Rishi Patel
(74) *Attorney, Agent, or Firm* — Quarles & Brady LLP

(57) ABSTRACT

Apparatus, methods, and other embodiments associated with NMR fingerprinting are described. One example NMR apparatus includes an NMR logic that repetitively and variably samples a (k, t, E) space associated with an object to acquire a set of NMR signals that are associated with different points in the (k, t, E) space. Sampling is performed with t and/or E varying in a non-constant way. The varying parameters may include flip angle, echo time, RF amplitude, and other parameters. The NMR apparatus may also include a signal logic that produces an NMR signal evolution from the NMR signals, and a characterization logic that characterizes a resonant species in the object as a result of comparing acquired signals to reference signals. The reference signals may be stored in a dictionary. Singular value decomposition may be applied to the dictionary and the acquired signals before comparing the acquired signals to the reference signals.

30 Claims, 21 Drawing Sheets

NUCLEAR MAGNETIC RESONANCE (NMR) FINGERPRINTING WITH SINGULAR VALUE DECOMPOSITION (SVD) COMPRESSION

FEDERAL FUNDING NOTICE

The invention was made with government support under the grant(s) EB017219 awarded by the National Institutes of Health. The government has certain rights in the invention.

BACKGROUND

Conventional magnetic resonance (MR) pulse sequences include a preparation phase, a waiting phase, and an acquisition phase that are configured to produce signals from which images can be made serially. The preparation phase determines when a signal can be acquired and determines the properties of the acquired signal. For example, a first pulse sequence may be designed to produce a T1-weighted signal at a first echo time (TE) while a second pulse sequence may be designed to produce a T2-weighted signal at a second TE. These conventional pulse sequences are typically designed to provide qualitative results where data are acquired with various weightings or contrasts that highlight a particular parameter (e.g., T1 relaxation, T2 relaxation).

When MR images are generated, they may be viewed by a radiologist and/or surgeon who interprets the qualitative images for specific disease signatures. The radiologist may examine multiple image types (e.g., T1-weighted, T2-weighted) acquired in multiple imaging planes to make a diagnosis. The radiologist or other individual examining the qualitative images may need particular skill to be able to assess changes from session to session, from machine to machine, and from machine configuration to machine configuration. Thus, the images are only as good as the image interpreter and all image based (e.g., qualitative) diagnoses end up being subjective.

Magnetic resonance fingerprinting (MRF) employs a series of varied sequence blocks that produce different signal evolutions in different resonant species (e.g., tissues) to which radio frequency (RF) energy is applied according to an MRF acquisition. The term "resonant species", as used herein, refers to an item (e.g., water, fat, tissue, material) that can be made to resonate using NMR. By way of illustration, when example apparatus and methods apply RF energy to a volume that has both bone and muscle tissue, then both the bone and muscle tissue will produce an NMR signal. However the "bone signal" and the "muscle signal" will be different. The different signals can be collected over a period of time to identify a signal evolution for the volume. Resonant species in the volume can then be characterized by comparing the signal evolution to known evolutions. In one embodiment, the "known" evolutions may be, for example, simulated evolutions and/or previously acquired evolutions. MRF may store a large set of known evolutions in a dictionary. Characterizing the resonant species can include identifying different properties of a resonant species (e.g., T1, T2, diffusion resonant frequency, diffusion co-efficient, spin density, proton density). Additionally, other properties including, but not limited to, tissue types, materials, and super-position of attributes (e.g., T1, T2) can be identified. MRF is described in United States Patent Application "Nuclear Magnetic Resonance (NMR) Fingerprinting", application Ser. No. 13/051,044, and in *Magnetic Resonance Fingerprinting*, Ma et al., Nature 495, 187-192 (14 Mar. 2013), the contents of both of which are incorporated herein by reference.

In MRF, characterizing the resonant species may be performed by comparing first information to second information. The first information may include the acquired NMR signals, the acquired signal evolution, or information derived from the acquired NMR signals or acquired signal evolution. The second information may include a stored signal evolution, a known signal evolution, a modeled signal evolution, information derived from stored signal evolutions, or information that is not a signal evolution. Both the first information and the second information may have a first high dimensionality. MRF may perform whole template matching that considers all the dimensions of the data. Conventionally, comparing the first information to the second information may be performed in various ways including, but not limited to, pattern matching, selection, minimization of a cost function, and optimization. The pattern matching may have been performed in a high dimensional space.

The result of the comparison may take different forms. In different embodiments, the result of the comparison may include, but is not limited to, an identification that the first information matches the second information, an identification that the first information matches the second information to within a tolerance, and an identification that there is a certain percent likelihood that the first information matches the second information. In other embodiments, the result of the comparison may include, but is not limited to, an identification of T1 for a resonant species, an identification of T2 for a resonant species, an identification of a diffusion coefficient, an identification of a spin density, an identification of a resonance frequency (e.g., chemical shift) and an identification of a proton density. In another embodiment, the comparison may include identifying the strength of a magnetic field (e.g., B0, B1) or may include identifying the strength of a gradient field. In yet another embodiment, the result of the comparison may identify a tissue type (e.g., brain, brain tumor) or may identify a material. Thus, the comparison may produce different results. In one embodiment, multiple results may be provided. For example, a weighted list of likely materials may be provided. In another example, multiple probabilities may be provided.

While conventional MRF has produced astounding improvements in MRI, performing full template matching between acquired signals and a conventional high dimension MRF dictionary may be computationally intensive, and thus may take a significant period of time. Improvements in processing time are constantly sought.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
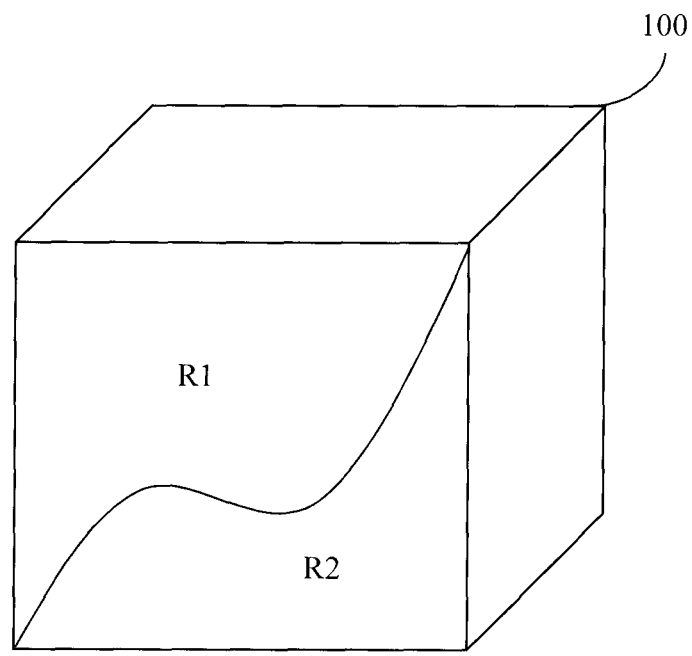
FIG. 1 illustrates a volume that contains two resonant species.

Example apparatus and methods improve conventional magnetic resonance fingerprinting (MRF) by performing singular value decomposition (SVD) compression on elements of an MRF dictionary to reduce processing time. Performing SVD compression on a high-dimension MRF dictionary and on a high dimension observed NMR signal facilitates performing template matching or other comparisons in a lower dimension SVD space. MRF acquires and processes magnetic resonance (MR) data to simultaneously provide quantitative maps of different tissue parameters through pattern recognition. A predefined or pre-established dictionary may model the possible signal evolutions simulated using, for example, Bloch equations with different combinations of various MR parameters. Pattern recognition may be completed by computing the inner product between the noisy signal and predicted signals in the dictionary. The dictionary may also store previously observed signal evolutions. Though conventional matching accurately predicts the MR parameters of interest, improved efficiency is desired to obtain quantitative images. Example apparatus and methods compress the dictionary using the SVD. The SVD provides a low-rank approximation of the higher rank dictionary. Compressing the size of the dictionary in the time domain speeds up the pattern recognition without sacrificing the high signal-to-noise ratio (SNR) of MRF.

MRF simultaneously provides quantitative maps of multiple tissue parameters. The quantitative mapping uses different combinations of the MR parameters of interest, such as T1, T2, and off-resonance. Observed signal evolutions are matched to dictionary entries using, for example, template matching. In one example, the inner product is computed between a noisy signal and dictionary entries to find the maximum. Parameter combinations unique to the entry corresponding to the maximum may then be output. While conventional MRF is robust and accurately predicts MR parameter values including T1, T2, and off-resonance, example apparatus and methods reduce the number of computations needed to retrieve MR values and, at the same time, maintain the demonstrated accuracy.

The SVD of a matrix can provide information about the properties of a matrix and can be applied to a variety of problems including the solution of linear least squares problems and dimensionality reduction through principal component analysis (PCA). Data compression using the SVD has been studied in, for example, the compression of electro-cardiogram (ECG) signals and for images. In the field of text mining, the SVD is applied to the term document matrix in a process known as latent semantic indexing to reveal the intrinsic structure of the matrix and to reduce its size. The SVD has even been applied to transform gene expression data into "eigengenes" and "eigenarrays".

SVD encoded MR has been used in MR to reduce acquisition time through dynamically adaptive imaging. SVD has also been considered to modify the block uniform resampling (BURS) algorithm for gridding non-uniform k-space data. Both SVD and eigenvalue decomposition have been used in parallel MRI as a way to calculate coil sensitivity maps, establishing a clear link between sensitivity encoding (SENSE) and generalized auto-calibrating partially parallel acquisitions (GRAPPA). SVD has also been used on low-tip-angle gradient-echo images to calculate the $B_1^+$ and $B_1^-$ fields.

Example apparatus and methods apply SVD to an MRF dictionary to reduce the size of the MRF dictionary in the time domain. Reducing the size of the MRF dictionary in the time domain yields faster reconstruction of the tissue parameters (e.g., T1, T2, off-resonance) without sacrificing the accuracy of MRF.

Example apparatus and methods may denote the MRF dictionary by $D \in C^{n \times t}$, where n is the number of parameter combinations and t is the number of time points. Example apparatus and methods may denote by $d_j$, j=1, ..., n the jth row of D. The dictionary match for an observed noisy signal evolution may be determined by a process similar to query or template matching. For example, the observed signal evolution, denoted x, may be compared to dictionary entries by using the complex inner product to determine which dictionary entry the signal evolution matches with highest probability. Values for T1, T2 and off resonance unique to that entry may then be assigned to that entry. In one embodiment, a dictionary entry $d_l$ may be chosen that satisfies:

$$d_l = \arg \max_{1 \leq j \leq n} |d_j x^*|$$

where x* denotes the conjugate transpose of the vector x and ‖ represents the modulus. Example apparatus and methods may normalize dictionary entries and measured signal evolutions to have unit length, $\|x\|=\|d_j\|1$, j=1, ..., n with $\|\ \|$ denoting the Euclidean norm. Once the match has been recovered, example apparatus and methods may assign to the signal the parameters T1, T2, and off-resonance corresponding to the matching dictionary entry. In one embodiment, T1, T2, off-resonance or other parameters may be stored in the dictionary. In another embodiment, T1, T2, or other parameters may be stored outside the dictionary and retrieved using the matching dictionary entry or an identifier of the matching dictionary entry.

Every matrix $A \in C^{p \times q}$ can be written using the SVD, which is given by $A=U\Sigma V^*$ where $U \in C^{p \times p}$ and $V \in C^{q \times q}$ are unitary matrices, and $\Sigma \in R^{p \times q}$ is a diagonal matrix with:

$$\sigma_1 \geq \sigma_2 \geq \ldots \geq \sigma_{min\{p,q\}}.$$

The columns of U, denoted $u_1, \ldots, u_p$ are called the left singular vectors of the matrix A, and the columns of V, denoted $v_1, \ldots, v_q$ are called the right singular vectors. The rank of A is defined to be the number of linearly independent columns (or equivalently, rows), so if rank(A)=r, then $r \leq \min\{p, q\}$, and in terms of the SVD, the rank is the number of nonzero singular values, that is:

$$\sigma_1 \geq \sigma_2 \geq \ldots \geq \sigma_r > \sigma_{r+1} = \sigma_{min\{p,q\}}=0.$$

The SVD allows A to be expressed as the sum of rank-one matrices $$A = \Sigma_{i=1}^r \sigma_1 u_i v_i^*,$$

and $(\sigma_i u_i v_i)$ is called a singular triplet. A rank-k approximation of A is given by truncating $A=\Sigma_{i=1}^r \sigma_1 u_i v_i^*$, at index k for $k \leq r$, $$A^{(k)} = \Sigma_{i=1}^k \sigma_1 u_i v_i^*.$$

The SVD provides the "best" low-rank approximation of A, that is $$\|A^{(k)} - A\|_2 = \inf \|B - A\|_2$$

where the infimum is taken over all p×q matrices B with rank less than or equal to k.

The total energy of A is defined to be the sum of the squares of the singular values, $$ER = \sum_{i=1}^r \sigma_i^2$$

The energy ratio ER represents that fraction of the energy retained in the rank-k approximation A(k), $$e(k) = \sum_{i=1}^k \sigma_i^2$$

The energy ratio ER can be useful in selecting a value for k and thus for determining an appropriate truncation index for a low rank approximation that retains as much of the information from the original matrix as desired.

Example apparatus and methods apply the SVD to the MRF dictionary $$D = U\Sigma V^*$$

where $U \in C^{n \times n}$ and $V \in C^{t \times t}$ are unitary matrices and $\Sigma \in C^{t \times n}$ is a diagonal matrix with $\sigma_1 \geq \sigma_2 \geq \ldots \geq \sigma_r$. Let r=rank(D) and note that, in one embodiment, it is assumed that n>t.

For a given index k, $1 \leq k \leq r$ the truncated SVD can be written in matrix form, yielding the low-rank approximation of the dictionary, $$D \approx U_k \Sigma_k V_k^*$$

where $U_k=[u_1, \ldots u_k]$ denotes the matrix containing the first k left singular vectors and similarly for $\Sigma_k$, $V_k$.

Another property of the SVD is that the first r right singular vectors $\{v_1, \ldots, v_r\}$ form an orthonormal basis for the rows of D. Thus, each dictionary entry can be written as a linear combination of orthogonal vectors. Projecting the dictionary onto the subspace spanned by the first k singular vectors $\{v_1, \ldots v_k\}$ produces a representation of the dictionary entries in the lower-dimensional space $C^k$ by multiplying $$D_k = DV_k.$$

This lower dimensional space may be referred to as the SVD space.

An observed MR signal x may be projected onto the same subspace spanned by the vectors in $V_k$ by multiplying $$x_k = xV_k$$

and now the match $d_j = \arg\max_{i \leq j \leq n} |d_j x^*|$ can be computed in the lower-dimensional SVD space $C^k$. Example apparatus and methods may search for the dictionary entry so that:

$$d_l = \arg \max_{1 \leq j \leq n} |(d_j V_k)x_k^*|$$

$$= \arg \max_{1 \leq j \leq n} |(d_j V_k)(xV_k)^*|$$

$$= \arg \max_{1 \leq j \leq n} |d_j V_k V_k^* x^*|.$$

Since V is a unitary matrix, the product $V_k V_k^*$ will approach the identity matrix as the truncation index k increases, thus approaching the original matching scheme. Selecting a k that is too large may compromise improvements in processing time while selecting a k that is too small may compromise improvements in pattern matching. Thus, example apparatus and methods may carefully consider k or dynamically select k.

Although example apparatus and methods take the extra step of projecting the observed signals onto the SVD space, the number of computations in the template match will be reduced yielding an overall improvement. In one embodiment, the signal is first projected, requiring ~2kt complex operations, and then the match is performed in $C^k$, requiring ~2 nk complex operations for 2k(n+t) total complex operations. Comparing this with the ~2 nt complex operations required per signal in the full template match, the number of computations can be significantly reduced depending on the choice of k.

Example apparatus and methods may perform an SVD basis compression and template matching that inputs a normalized dictionary $D \in C^{n \times t}$, a matrix $V_k \in C^{t \times k}$ that contains the first k right singular vectors of the dictionary, and a measured and normalized signal evolution x. Example apparatus and methods may then output MR parameters of interest including, for example, T1, T2, and proton density.

Example apparatus and methods may produce the outputs from the inputs by projecting the dictionary onto the SVD spanned by the vectors $\{v_1, \ldots, v_k\}$ $$D_k = DV_k.$$

Example apparatus and methods may then project the normalized signal evolution x onto the SVD space using:

$$x_k = xV_k.$$

Example apparatus and methods may then perform matching in $C^k$ using the projected signal and the projected dictionary to find the entry that satisfies:

$$\max_{1 \leq j \leq n} |(d_j V_k) x_k^*|.$$

MR parameters of interest may then be recovered from the projected dictionary entry that satisfies $$\max_{1 \leq j \leq n} |(d_j V_k) x_k^*|.$$

Recall that example apparatus and methods may denote the MRF dictionary by $D \in C^{n \times t}$, where n is the number of parameter combinations and t is the number of time points. Recall also that example apparatus and methods may perform an SVD basis compression and template matching that inputs dictionary $D \in C^{n \times t}$, a matrix $V_k \in C^{t \times k}$ that contains the first k right singular vectors of the dictionary, and a measured and normalized signal evolution x. As described above, data may be projected after image reconstruction. This may yield t singular images to be processed. In one embodiment, instead of projecting data after image reconstruction, raw k-space data can be projected prior to gridding non-uniform spiral data. An inverse Fourier transform may then be applied to the projected data. In this embodiment, the number of reconstructed images obtained is reduced, which yields k singular images instead of t images. K may be chosen to be, for example, less than 200. T is likely to be much larger than 200. Therefore, a large amount of processing may be avoided by projecting raw k-space data prior to gridding non-uniform spiral data. Processing k singular images instead of t singular images saves the processing time associated with processing (t−k) singular images.

Example apparatus and methods were evaluated using a dictionary with n=459,675 entries at each of t=1000 simulated time points. 5675 different combinations of T1 and T2 values were employed. The T1 values ranged from 100 to 2000 ms in increments of 10 ms. The T2 values ranged from 5 ms to 200 ms in increments of 5 ms below a value of 100 ms and increments of 10 ms above a value of 100 ms. 81 different off-resonance frequencies were used, with 1 Hz increments from −40 Hz to 40 Hz. This evaluation configuration produced a dictionary $D \in C^{49,675 \times 1000}$. Computation of the right singular vectors of this evaluation dictionary took approximately two minutes. Note that computing the right singular vectors is performed once per dictionary and imaging sequence and thus this computation can be performed without significant time constraints.

Figure 10:
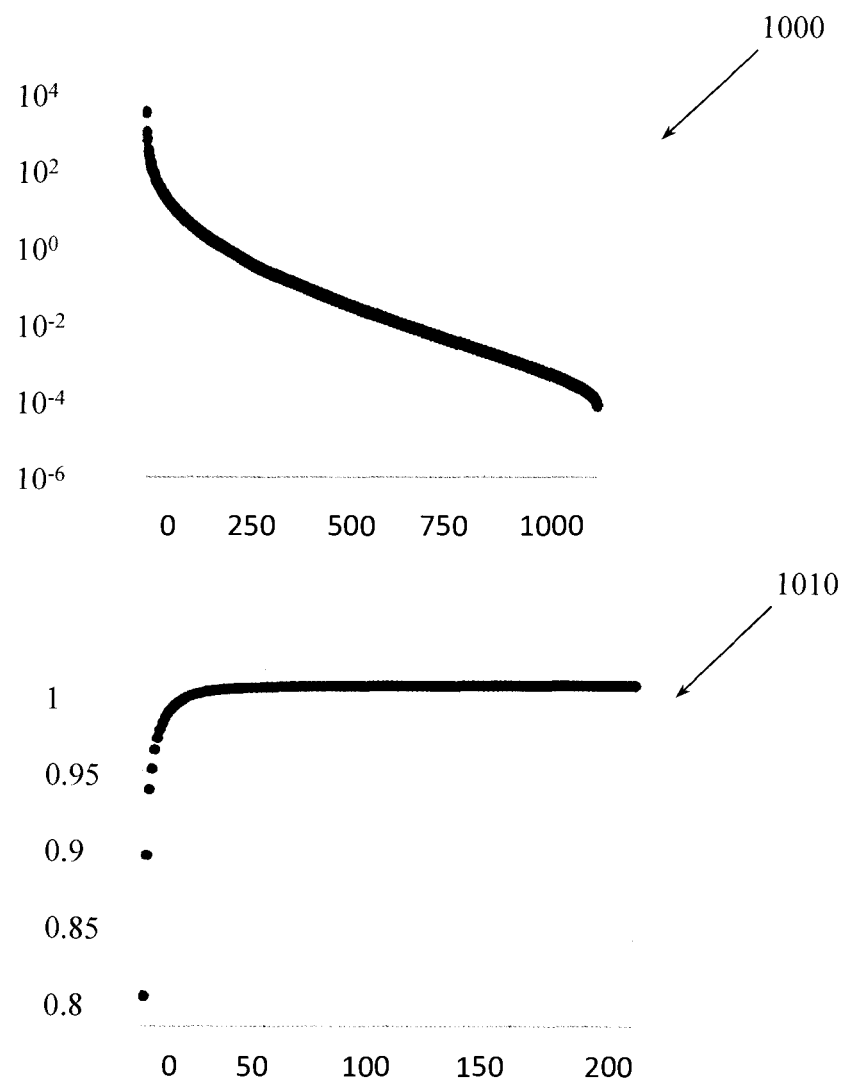
FIG. 10 illustrates a plot of the singular values of an example MRF dictionary and the associated energy ratio for the first two hundred singular values.

FIG. 10 illustrates a plot 1000 of the singular values of an example MRF dictionary and the associated energy ratio for the first two hundred values. Plot 1010 reveals that much of the useful information that is available through MRF is concentrated in the first two hundred singular values and vectors. Table I shows the energy ratio for a selected number of k singular values. Results for the SVD approach were evaluated against the conventional full template matching scheme using the first 10, 25, 50, 100, and 200 singular vectors.

TABLE 1

| k | 10 | 25 | 50 | 100 | 200 |
|---|----|----|----|-----|-----|
| e(k) | .9835 | .9963 | .9993 | .9999 | .9999 |

The projection of the observed signal x gives a k-dimensional weight vector $x_k = [xv_1, xv_2, xv_k]$, which is used to approximate x as a linear combination of the first k right singular vectors according to, for example:

$$x \approx \Sigma_{i=1}^k (xv_i) v_i.$$

Figure 11:
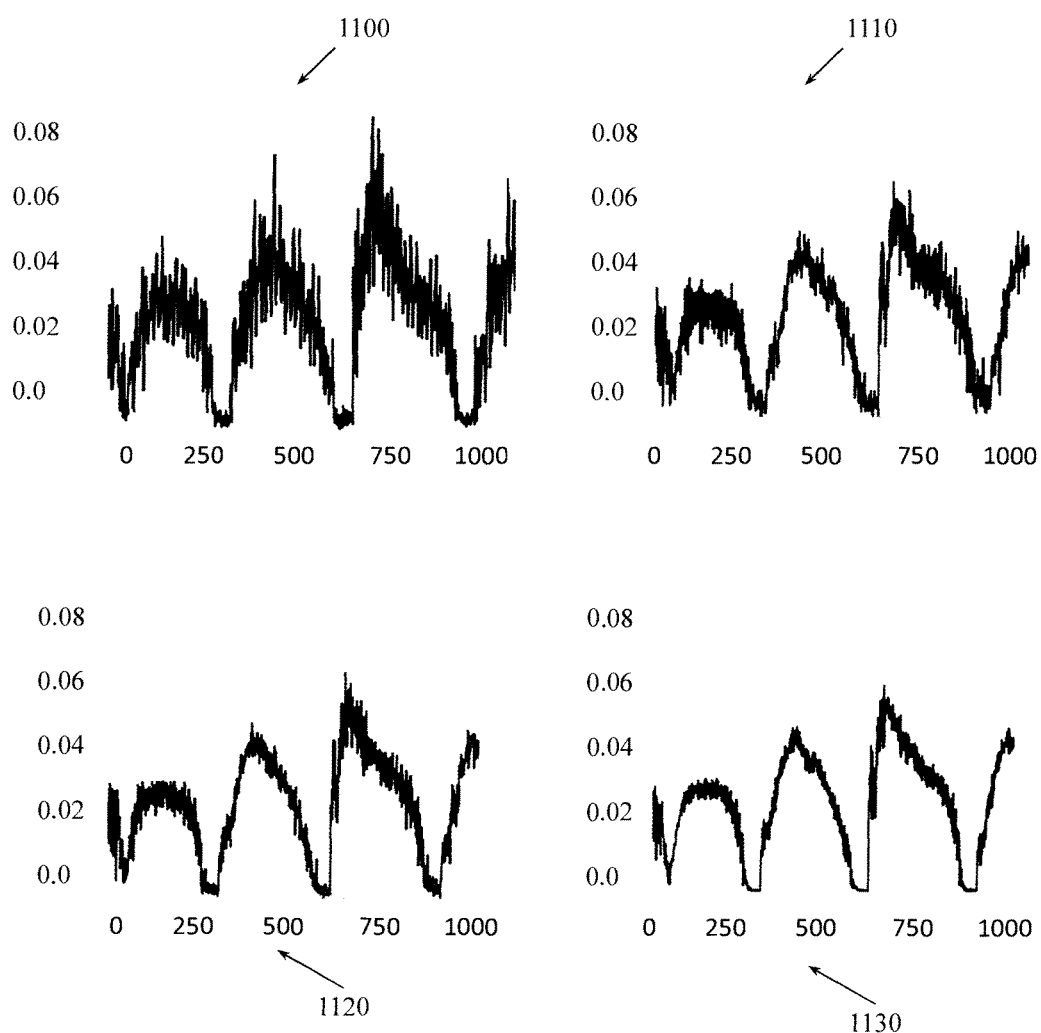
FIG. 11 illustrates a plot of a noisy signal evolution gathered from under-sampled data and its approximation using k=200, 100, and 25 singular vectors, where k is the number of singular values.

FIG. 11 illustrates plots of a noisy signal evolution gathered from under-sampled data and its approximation using k=200, 100, and 25 singular vectors. Plot 1100 illustrates a noisy observed signal. Plot 1110 illustrates an approximation using the basis of the singular vectors in $V_k$ with k=200. Plot 1120 illustrates an approximation using the basis of the singular vectors in $V_k$ with k=100. Plot 1130 illustrates an approximation using the basis of the singular vectors in $V_k$ with k=25. Choosing a smaller k, which results in using fewer singular vectors in the approximation, has the effect of damping the oscillations in the signal, though there may be a tradeoff between controlling the noise and maintaining the accuracy of the dictionary match.

Assessing the performance of SVD basis compression and template matching involves computing the SNR of the output. The SNR of the output is computed as the mean value divided by the standard deviation of the values using various levels of noise. A dictionary entry is selected (e.g., at random) and added to simulated Gaussian white noise. SVD basis compression and template matching is then performed to predict the T1, T2, and off-resonance values and to compare the predicted values with the actual values. The process was repeated one thousand times and the SNR was computed.

Figure 12:
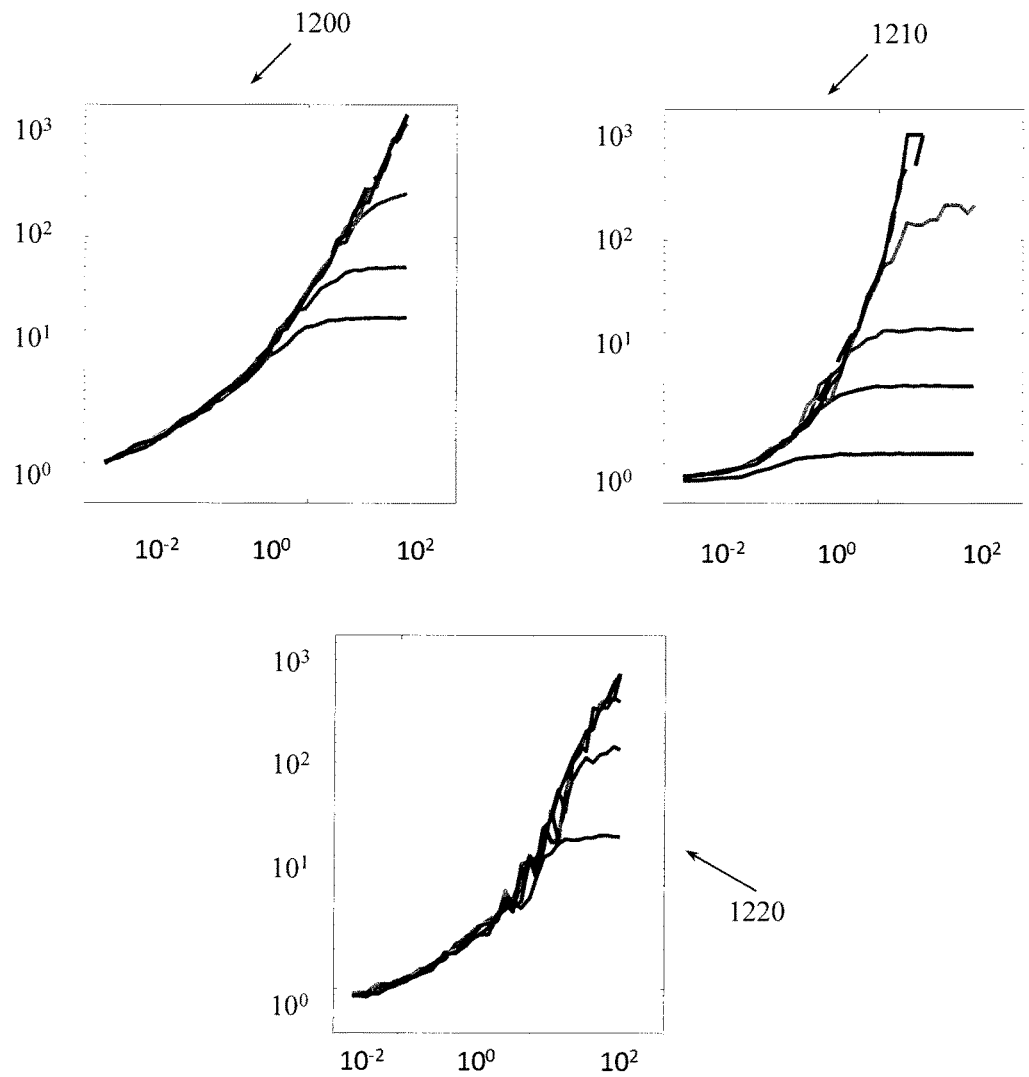
FIG. 12 illustrates the results of output signal-to-noise ratio (SNR) versus input SNR using 10, 25, 50, 100, and 200 singular vectors.

FIG. 12 illustrates the results of output SNR versus input SNR using 10, 25, 50, 100, and 200 singular vectors. For T1 and off-resonance, the SNR of the full template matching and SVD basis compression and template matching are approximately the same using 100 singular vectors. For T2, 200 singular vectors were needed to match the SNR of the full template matching scheme. These results indicate that data can be compressed to between 10% and 20% of the original size while retaining the information inherent in the original signal. Plot 1200 illustrates output versus input SNR for T1 of SVD compression combined with template matching using 10, 25, 50, 100, and 200 singular vectors compared with the SNR of the template matching using the full dictionary. Plot 1210 illustrates output versus input SNR for T2 of SVD compression combined with template matching using 10, 25, 50, 100, and 200 singular vectors compared with the SNR of the template matching using the full dictionary. Plot 1220 illustrates output versus input SNR for off-resonance of SVD compression combined with template matching using 10, 25, 50, 100, and 200 singular vectors compared with the SNR of the template matching using the full dictionary.

Figure 13:
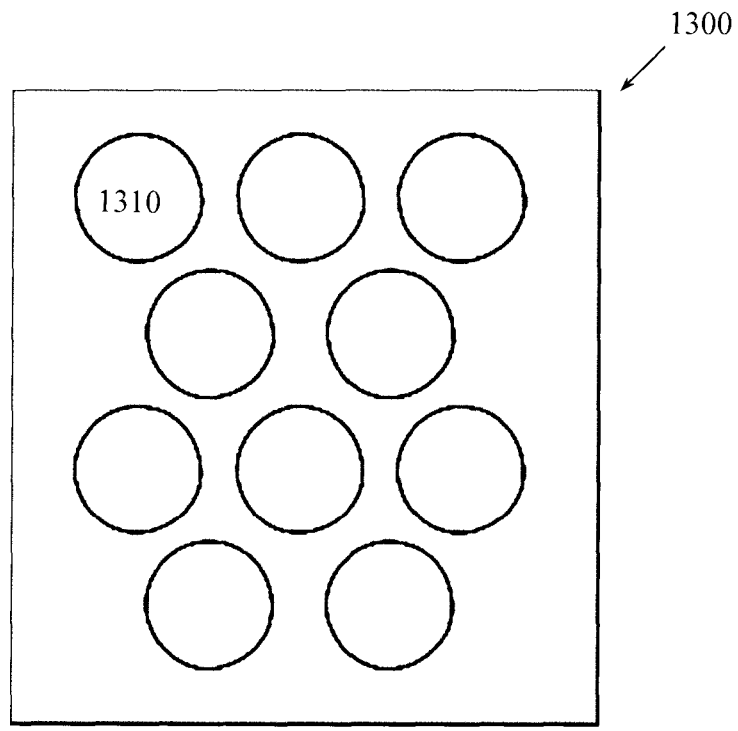
FIG. 13 illustrates a region in an image of a phantom.

Under-sampled data was collected using a phantom. SVD was applied to reconstructed images to obtain projections in the SVD space. Template matching was performed to retrieve T1 and T2 values. FIG. 13 illustrates a region 1310 in an image of a phantom.

Figure 14:
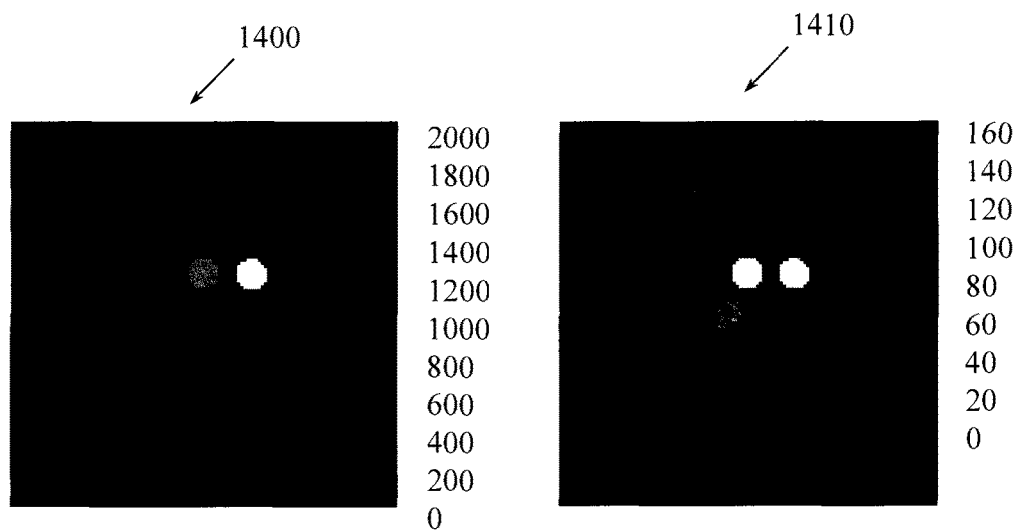
FIG. 14 illustrates T1 and T2 maps computed using an example SVD compression and template match using 100 singular vectors.

FIG. 14 illustrates T1 and T2 maps computed using the SVD compression and template match using 100 singular vectors. Parameter map 1400 illustrates T1 for phantom data using 100 singular vectors. Parameter map 1410 illustrates T2 for phantom data using 100 singular vectors.

Figure 15:
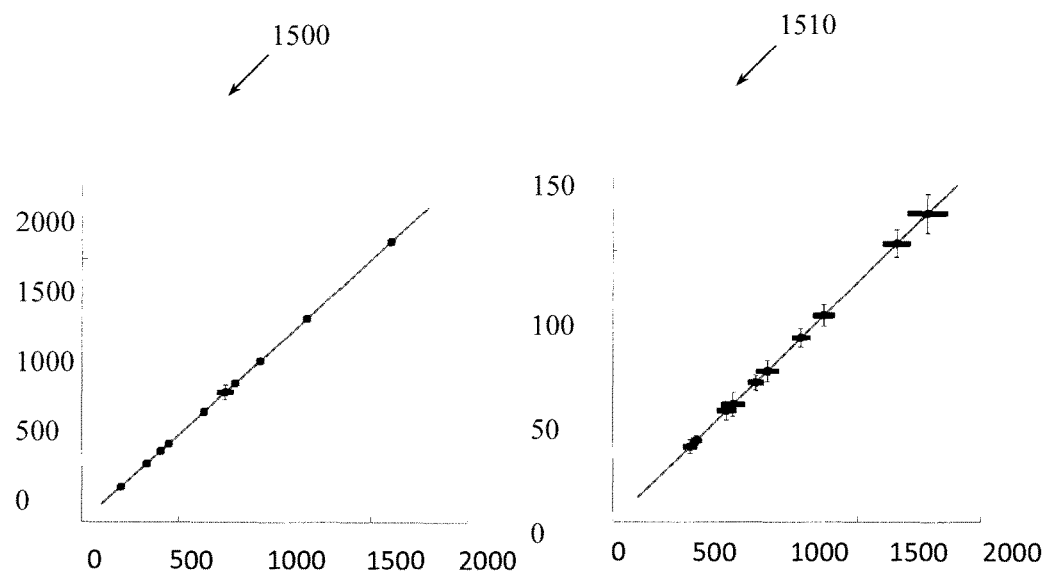
FIG. 15 illustrates comparisons of SVD computed results with full template matching results.

FIG. 15 illustrates comparisons of the SVD computed results with the full template match. Plot 1500 is a correlation plot that compares the computed T1 values using the full template match and the SVD template match with 100 singular vectors. Plot 1510 is a correlation plot that compares the computed T2 values using the full template match and the SVD template match with 100 singular vectors. The mean values of the two methods are practically indistinguishable. The error bars represent one standard deviation of the measured data. The SVD and conventional full template match are consistent and predict the same T1 and T2 values.

Figure 16:
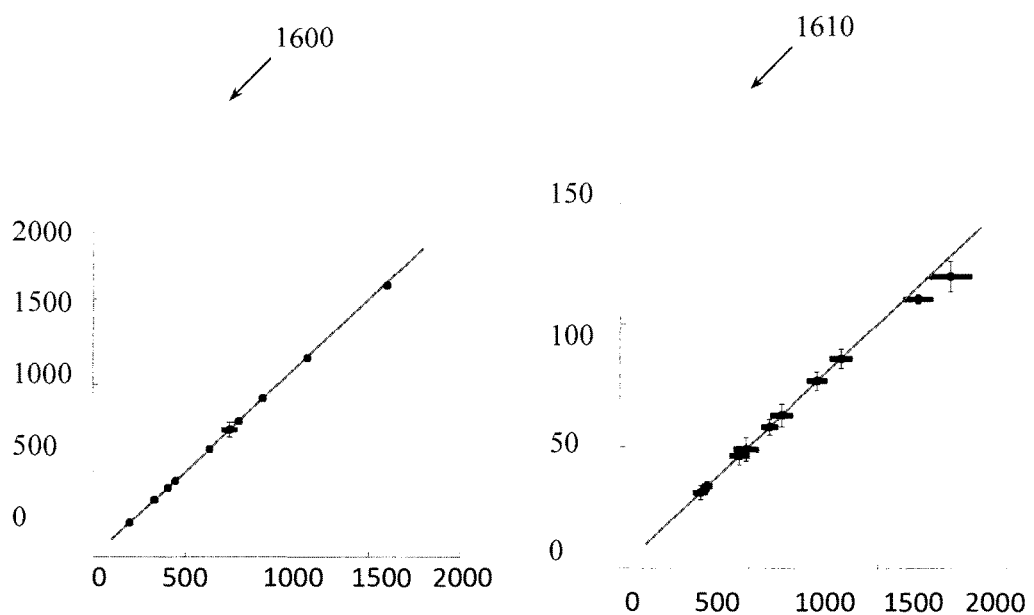
FIG. 16 illustrates variations between methods.

FIG. 16 illustrates that variations between the methods appear when the number of singular vectors is reduced beyond a threshold. For example, variations begin to appear when the number of singular vectors is reduced to fifty, and the variations increase when the number of singular vectors is reduced to twenty-five. Plot 1600 is a correlation plot that compares the computed T1 values using the full template match and the SVD template match with 25 singular vectors. Plot 1610 is a correlation plot that compares the computed T2 values using the full template match and the SVD template match with 25 singular vectors.

Figure 17:
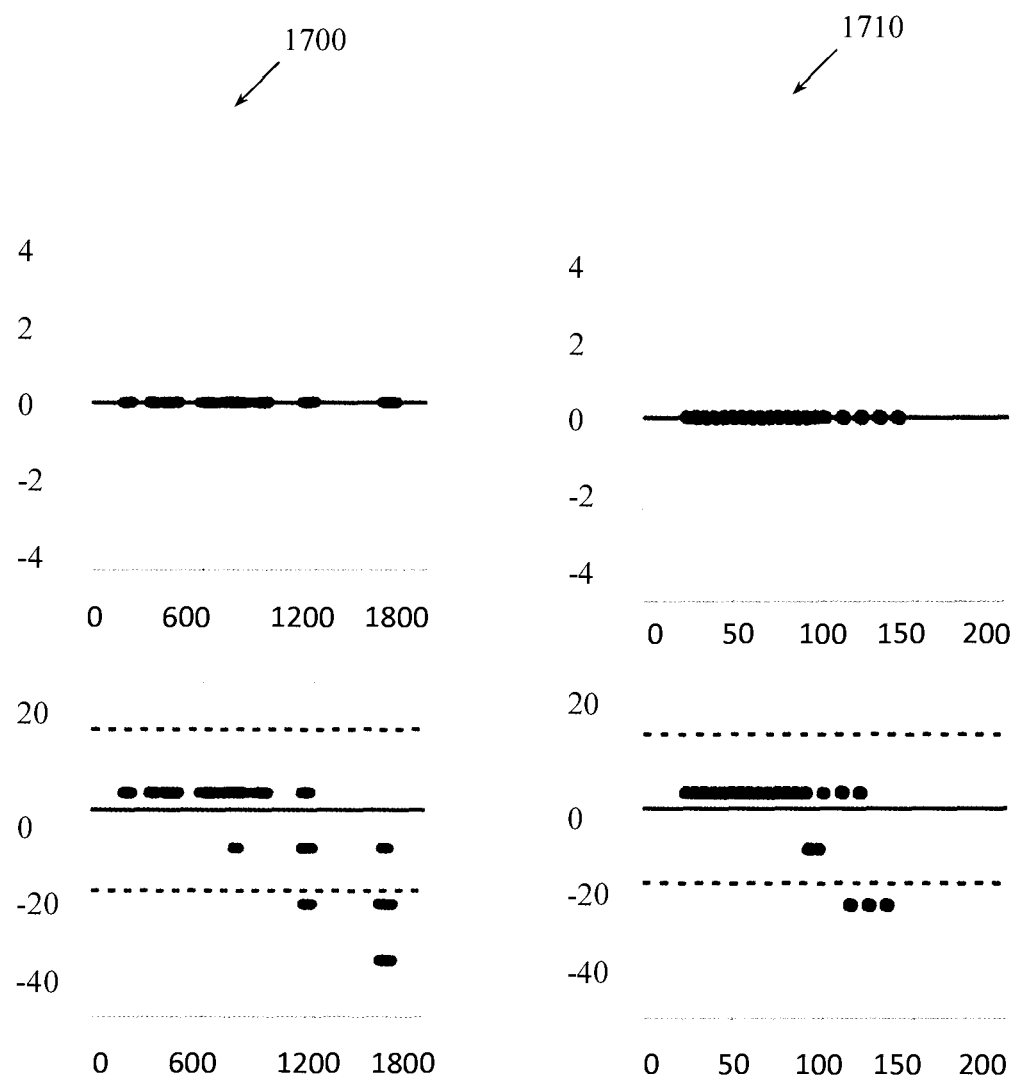
FIG. 17 illustrates Bland-Altman plots to compare T1 and T2 values computed using full template matching with example SVD methods.

FIG. 17 illustrates Bland-Altman plots to compare T1 and T2 values computed using the full template match with the example SVD methods. The horizontal dashed lines show a 95% confidence interval for the difference between the computed and standard values. When k=100, the SVD results align well with the full template match results. When k=25, the SVD results differ. The table shows that the differences between the two methods are within two to three steps in the dictionary resolution. Reconstructions of the parameters took approximately 7.36 seconds using 100 singular vectors. Reconstructions of the parameters took approximately 77 seconds using the full template match. Table 2 illustrates computation times for different values of k.

TABLE 2

| k | 10 | 25 | 50 | 100 | 125 | 150 | 175 | 200 |
|---|----|----|----|-----|-----|-----|-----|-----|
| Time(s) | 4.67 | 5.86 | 5.90 | 7.36 | 8.50 | 9.15 | 9.45 | 11.11 |

Example SVD apparatus and methods were applied to volunteer data collected on a 1.5 T whole body scanner (e.g., Siemens Espree, Siemens Healthcare). The data was acquired using a spiral trajectory with 48 spiral arms. In this example, a slightly more coarse dictionary of 363,624 elements and 1,000 time points was used to encompass larger ranges for T1, T2, and off-resonance values for human data. In this example dictionary, the T1 values range from 100 ms to 5000 ms in increments of 20 ms below 2000 ms and increments of 300 ms above 2000 ms. In this example dictionary, the T2 values range from 20 ms to 1900 ms, with increments of 5 ms below a value of 100 ms, increments of 10 ms between 100 ms and 200 ms, and increments of 200 ms between 300 ms and 1900 ms resulting in a total of 3336 combinations of T1 and T2. One hundred and nine off-resonance frequencies were used, including the interval between −50 Hz to 50 Hz in increments of 1 Hz, and the additional frequencies −250 Hz, −230 Hz, −210 Hz, −190 Hz, 180 Hz, 200 Hz, 220 Hz, and 240 Hz.

Figure 18:
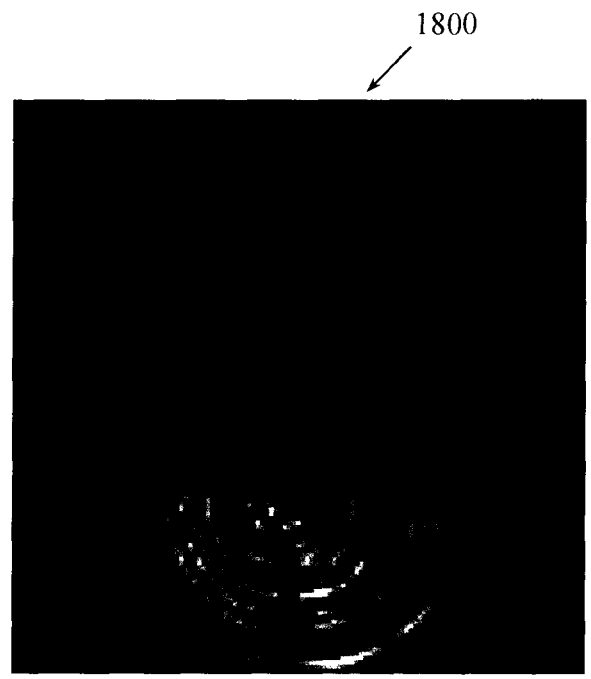
FIG. 18 provides an example conventional image.

Conventional MRF systems may reconstruct data in k-space to obtain a set of one thousand under-sampled images formed from the data of one of the spiral arms. FIG. 18 provides an example conventional image 1800.

Figure 19:
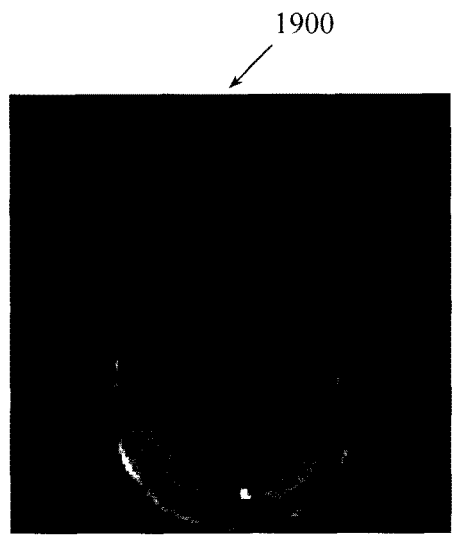
FIG. 19 illustrates example singular images.
Figure 19:
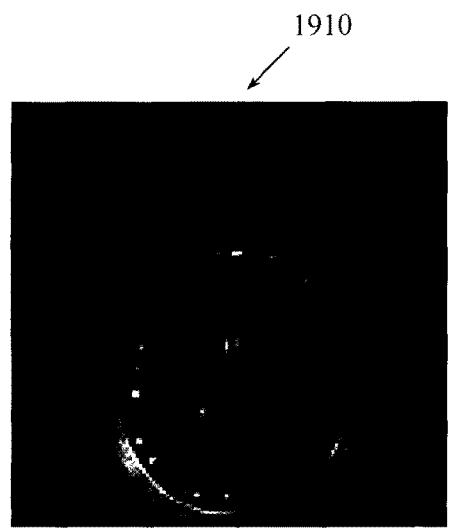
Figure 19:
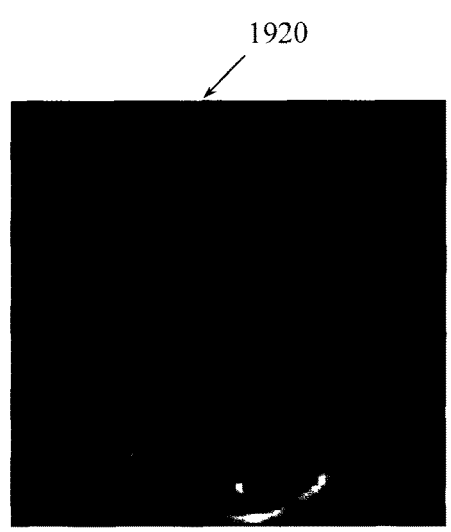

Example apparatus and methods applied the SVD to the raw data to reconstruct k images by combining the data from each of the 48 spiral arms at each of the 1,000 time points. FIG. 19 illustrates example singular image 1900, example singular image 1910, and example singular image 1920. Singular images 1900, 1910, and 1920 may represent the first three singular images. The image resolution in FIG. 19 is 128×128 pixels. Since the dictionary may not be centered prior to computing the SVD, the first singular image may be a close approximation of the mean. Example apparatus and methods may then apply template matching at each pixel location using the sequence of singular images at the SVD compressed signals. The template match in the SVD space may produce quantitative maps for T1, T2, or off-resonance frequency. Performing a full template match on the masked image took 167 seconds, while the template match in the SVD space took just 24 seconds using 25 singular vectors and 49 seconds using 200 singular vectors.

Figure 20:
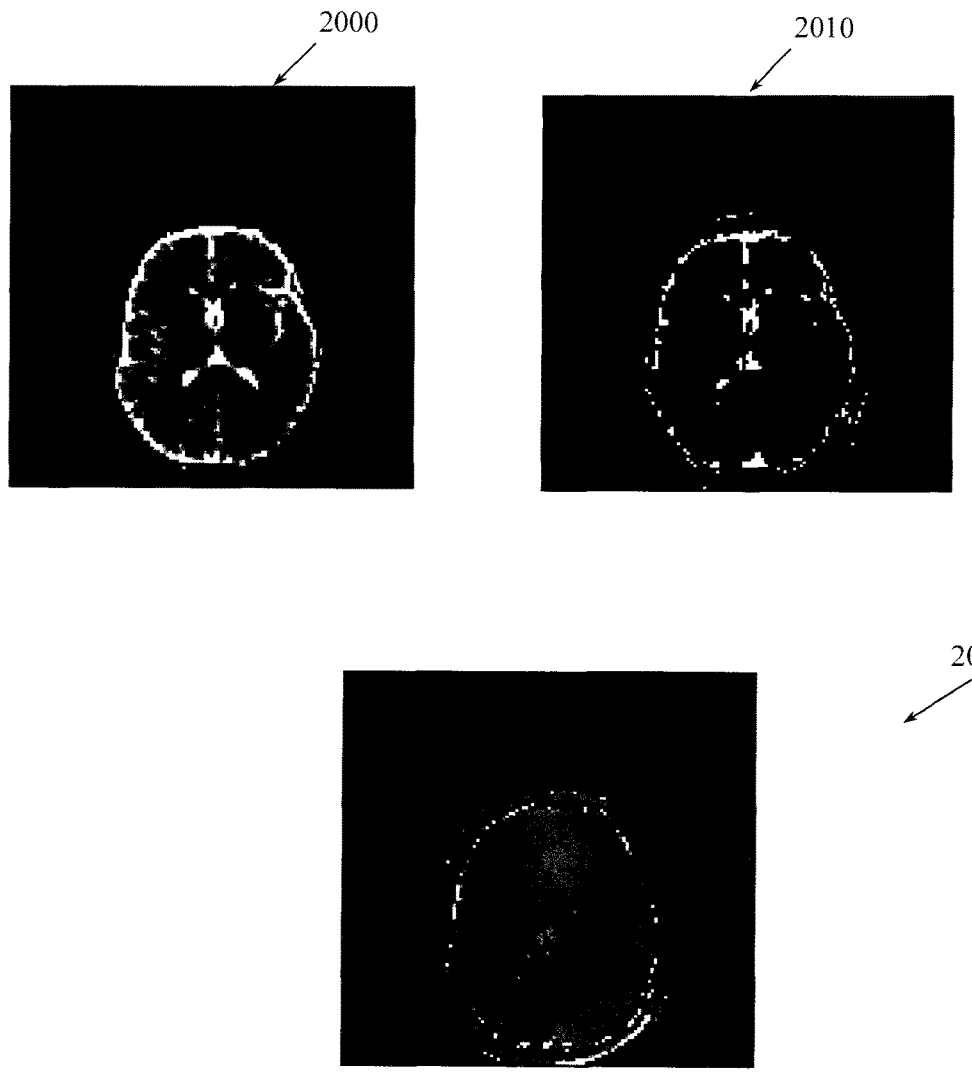
FIG. 20 illustrates plots of computed parameter maps.

FIG. 20 illustrates plots of the computed parameter maps. Plot 2000 shows a parameter map for T1 using 200 singular vectors for template matching. Plot 2010 shows a parameter map for T2 using 200 singular vectors for template matching. Plot 2020 shows a parameter map for off-resonance using 200 singular vectors for template matching.

Figure 21:
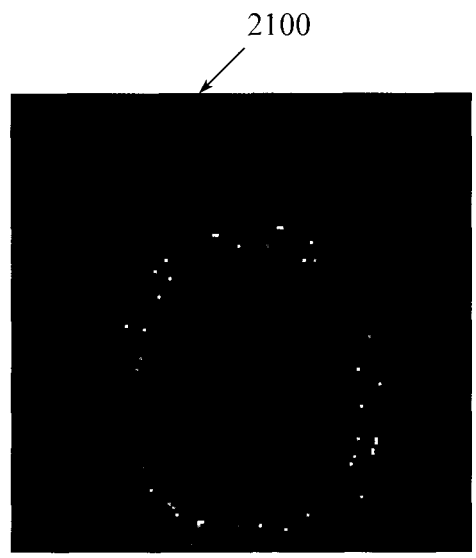
FIG. 21 illustrates relative difference maps.
Figure 21:
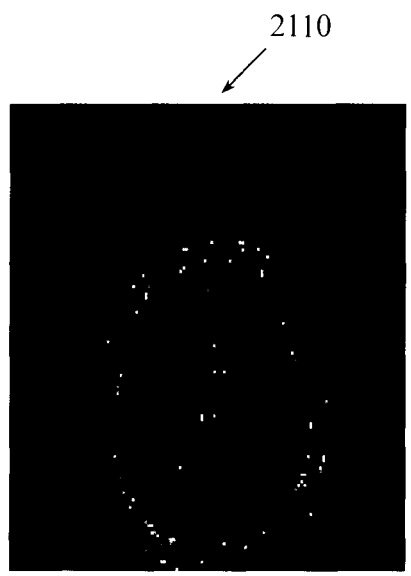
Figure 21:
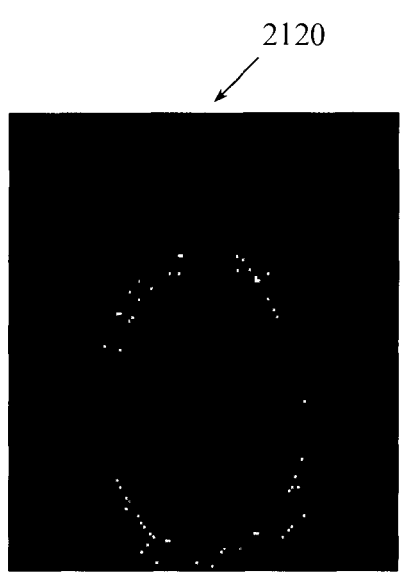

FIG. 21 illustrates relative difference maps. FIG. 21 shows relative error of the parameter maps illustrated in FIG. 20 computed using an example method as compared to maps produced using a full template match. Plot 2100 shows relative error for T1, plot 2110 shows relative error for T2, and plot 2120 shows relative error for off-resonance. The example relative difference maps were computed at each pixel. For plot 2100 for T1 the difference was computed by:

$$\frac{T_1^{SVD}(j) - T_1^{MRF}(j)}{T_1^{MRF}(j)}$$

where $T_1^{SVD}(j)$ denotes the computed T1 value at pixel j using the SVD method and $T_1^{MRF}(j)$ denotes the computed T1 value at pixel j using the full MRF template match.

Example apparatus and methods provide superior performance in the time domain compared to conventional systems. In one embodiment, SVD compression and template matching produced MR parameters ten times faster than conventional full template matching with 100 singular vectors. In one embodiment, SVD compression and template matching produced MR parameters three times faster than conventional full template matching with 200 singular vectors. The quality of parameter maps produced using the faster SVD approach were comparable to parameter maps produced using the full template matching approach.

Different embodiments may employ different approaches to select the number of singular vectors to include in the approximation of the dictionary. In one embodiment, the number of singular vectors to include may be determined by the energy ratio. The energy ratio indicates how much information from the original dictionary is retained in the low-rank approximation. Table 1 illustrated example energy ratio values. In another embodiment, the number of singular vectors to include may be determined by an approximate L-curve.

Larger objects like human bodies are made up of smaller objects like arms and legs and hips. The smaller objects are in turn made up of smaller parts like skin, muscle, fat, bone, tendon, and prosthetics. These smaller parts are in turn made up of even smaller things like water and minerals. The water and minerals are themselves made up of even smaller things (e.g., hydrogen, oxygen) which in turn are made up of even smaller things (e.g., electrons orbiting a nucleus). The nucleus may include a proton that exhibits "spin". A human body has a large number of protons and thus a large number of spins.

In the presence of a magnetic field, some of the spins will align in one direction (e.g., N/S) with respect to that magnetic field while other spins will align in an opposite direction (e.g., S/N) with respect to that magnetic field. Conventional MRI manipulates the magnetic field so that a net alignment in one direction is achieved. Conventional MRI further manipulates the magnetic field so that local differences in the field are achieved to allow spatial encoding. For example, x, y, and z gradients may be applied to create local variations in the larger magnetic field. The local variations allow the excitation of some spins without the excitation of other spins. Selective excitation is possible because of the Larmor relationship between magnetic fields and spins. The Larmor relationship describes how the frequency at which spins accept RF energy is related to the magnetic field in which the spins are located.

With the local variations created, RF energy may be applied to selected sets of spins associated with a local variation to make those spins behave in a certain way. For example, spins may be forced into a high energy state and forced away from their default alignment. When the RF energy is removed, the spins may return or may be forced to return to their default alignment. Different spins may return to their default alignment at different rates. Similarly, spins may return to their default alignment for different reasons. As the spins return from the forced alignment to the natural alignment, the spins produce a signal that can be detected for a short period of time.

MRF manipulates the magnetic field and manipulates the application of RF energy at different frequencies. MRF may employ pseudo-random routines that allow a volume to produce the signal(s) the volume is going to produce in response to a variety of changing conditions created by a variety of changing applications of RF energy. In one embodiment, MRF then compares a signal that evolves from the received signals to known signals received from other acquisitions at other times under similar conditions or to a set of simulated expected or predicted curves. Example apparatus and methods compress the dictionary of known signals using SVD. If the received signal evolution matches or can be fit to within a threshold of a known, simulated, or predicted signal evolution, then the volume that generated the signal evolution likely holds the same number, type, and mixture of spins as the volume that produced that matched or fitted signal evolution. More generally, first information associated with NMR signals acquired in response to NMR fingerprinting excitation is compared to second information associated with reference responses to MRF excitation to characterize a property of a material subjected to the MRF excitation. Both the first information and/or the second information may be reduced using SVD.

The frequency at which water in a volume will accept RF energy is determined by the magnetic field in which the water is located. The frequency can be computed when the magnetic field is known. The frequency at which fat in the same volume will accept RF energy is also determined by the magnetic field in which the fat is located. This frequency can also be computed when the magnetic field is known. Thus, applying multiple frequencies can induce multiple resonant species to resonate. Applying the multiple frequencies under a series of different conditions at different times can cause the resonant species to resonate in different ways. Additionally, applying the multiple frequencies under different conditions at different times can cause the resonant species to resonate and relax in different ways. The different resonations and different relaxations may yield a unique signal evolution for a combination of resonant species. Since the frequency is determined by the magnetic field, the magnetic field may be determined when the frequency is known by analyzing received signal in light of reference signals.

If a volume only has water, then the volume will only produce one signal. If the volume only has fat, then the volume will also only produce one signal, but it will be a different signal. Different amounts of fat and water in the same volume will yield different signals. The combination of signals acquired under different conditions may yield nearly infinitely unique signal evolutions. While the human body is a complicated thing, from a certain point of view it is not that complicated. Every volume in a human body can only hold a finite set of things arranged in a finite set of ways. Over time, a comprehensive library of reference information including, but not limited to, signal evolutions associated with many of the most relevant combinations of resonant species may be acquired and be available to NMR fingerprinting apparatus. The library may store signals that may be referred to as baseline signatures or known signal evolutions. In different embodiments, the library may store simulated and/or predicted signal evolutions. Thus in different examples, "known" signal evolutions may include previously acquired signal evolutions and/or simulated signal evolutions. Additionally, a dictionary or other reference store may include information that is a function of a signal evolution. For example, two signal evolutions may be combined into a different piece of information. Similarly, a single signal evolution may be transformed into a different piece of information. Both signal evolutions and information derived from, computed from, or that is otherwise a function of a signal evolution may be stored. Additionally, in one embodiment, a dictionary or other reference store may include information that did not start as a signal evolution or that is not derived from a signal evolution. Example apparatus may manipulate the dictionary using SVD to produce a lower dimensional SVD space $C^k$.

Using pattern matching to compare acquired signal evolutions to known signal evolutions may include analyzing a cross-correlation between signal evolutions of different tissues acquired using sequence blocks having different parameters. Ideally, a signal evolution would fit to exactly one member of the multi-dimensional set of known evolutions. However, a signal evolution may have relationships with more than one reference signal. Thus, in one embodiment, a result of comparing a signal evolution to a reference signal may be an identification of a reference signal with which the signal evolution is related and a measurement characterizing the relationship. For example, a signal evolution may be identified as matching a reference signal to within a desired tolerance. Similarly, a signal evolution may be identified as being x % likely to match a reference signal. In another embodiment, a signal evolution may be identified as being a weighted sum of a number of reference signals. One dimension of the multi-dimensional set could, for example, be associated with a first set of acquisition and/or excitation parameters while a second dimension of the multi-dimensional set could, for example, be associated with a second set of excitation and/or acquisition parameters. Over time, the members of the multi-dimensional set could be adapted based on fits that are achieved from live data. Over time, sequence blocks and/or combinations of sequence blocks that yield a more identity-matrix like result may be favored over sequence blocks that yield a matrix with more off-diagonal contributions. This adaptation of sequence blocks and/or series of sequence blocks based on observed results may contribute, for example, to calibrating a particular NMR apparatus for MR fingerprinting.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable storage medium", as used herein, refers to a non-transitory medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"User", as used herein, includes but is not limited to one or more persons, software, computers or other devices, or combinations of these.

FIG. 1 illustrates a volume 100 (e.g., voxel) that contains two resonant species R1 and R2. R1 and R2 may have different properties (e.g., relaxation parameters, non-relaxation parameters). For example, the $T1_{R1}$ may be less than $T1_{R2}$ while $T2_{R1}$ may be greater than $T2_{R2}$. In another example, a spin density for R1 may differ from a spin density for R2. Conventional MR systems may acquire a T1 weighted data set and then acquire a T2 weighted data set and then register the data sets. MRF systems apply RF energy in a series of varied sequence blocks that cause volume 100 to simultaneously produce different NMR signals from both R1 and R2. A signal evolution can be produced from these simultaneously produced different NMR signals. Information including relaxation parameters (e.g., T1, T2), and non-relaxation parameters (e.g., diffusion coefficient, spin density, proton density, magnetic field strength) can be determined from the signal evolution by comparing the acquired signal to reference information. Example apparatus and methods may perform SVD on the reference information to reduce the time required to perform pattern matching or material characterization. In one embodiment, the comparing may include pattern matching to other signal evolutions for which relaxation parameters are known. Once a matching dictionary entry has been identified, the resonant species R1 and R2 can then be characterized. Since different tissues have different known properties (e.g., relaxation parameters, non-relaxation parameters), different tissues can be identified using the characterization. While two resonant species are illustrated, a volume may include a greater or lesser number of resonant species.

Figure 2:
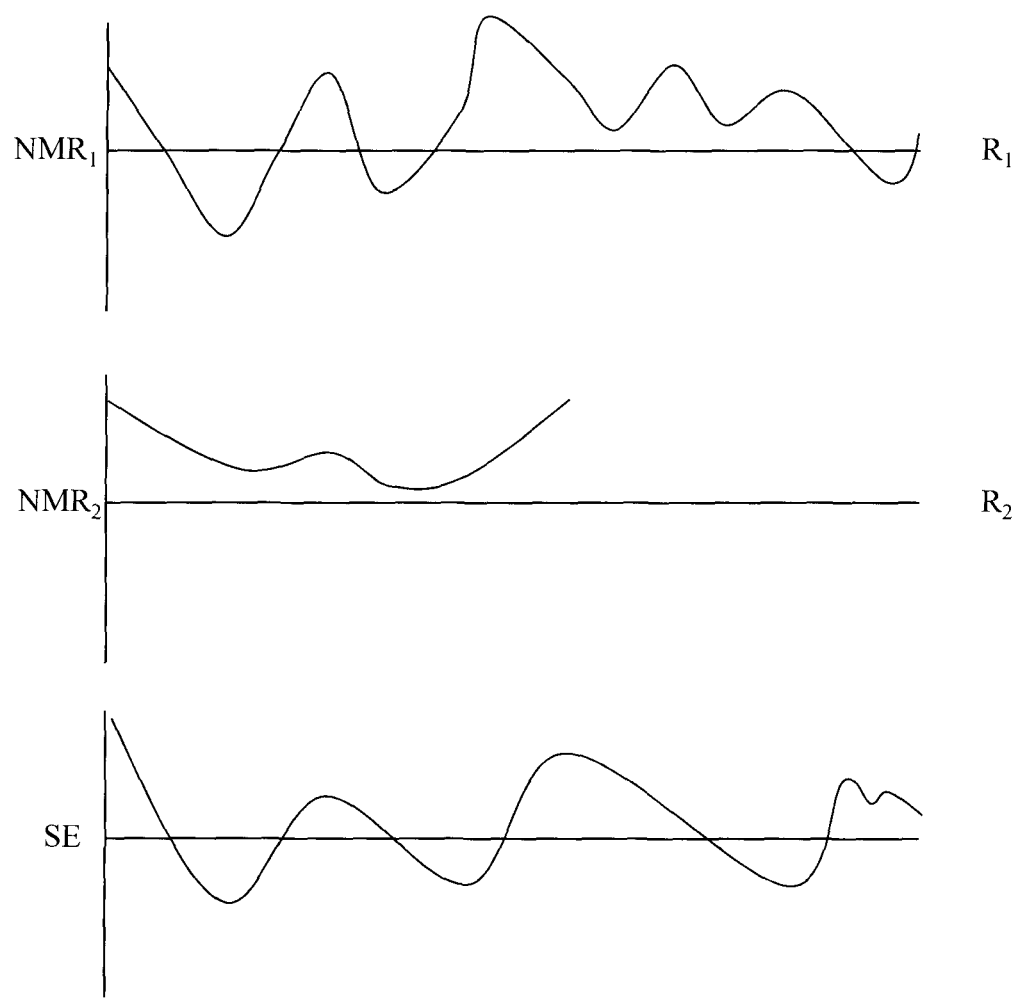
FIG. 2 illustrates two individual NMR signals received from two resonant species and a signal evolution derived from the two individual NMR signals.

FIG. 2 illustrates plots of two individual NMR signals $NMR_1$ and $NMR_2$ received from the two resonant species R1 and R2 in volume 100. $NMR_i$ includes data points generated by R1 under different conditions at different times. $NMR_2$ includes data points generated by R2 under the different conditions at the different times. Signal evolution SE results from $NMR_1$ and $NMR_2$ being generated and acquired simultaneously. The space from which the data points for $NMR_1$ and $NMR_2$ is acquired may be referred to as a (k, t, E) space, where in different examples, E refers to (T1, T2, D), (T1, T2, D, ... ), (T1, T2, ... ) where D refers to diffusion relaxation. In one example, both t and E may be non-linear. In another example, both t and E may be pseudo-random. Once again, while two plots associated with two resonant species are illustrated, a volume may include a greater or lesser number of resonant species and thus may produce a greater or lesser number of signals.

Figure 3:
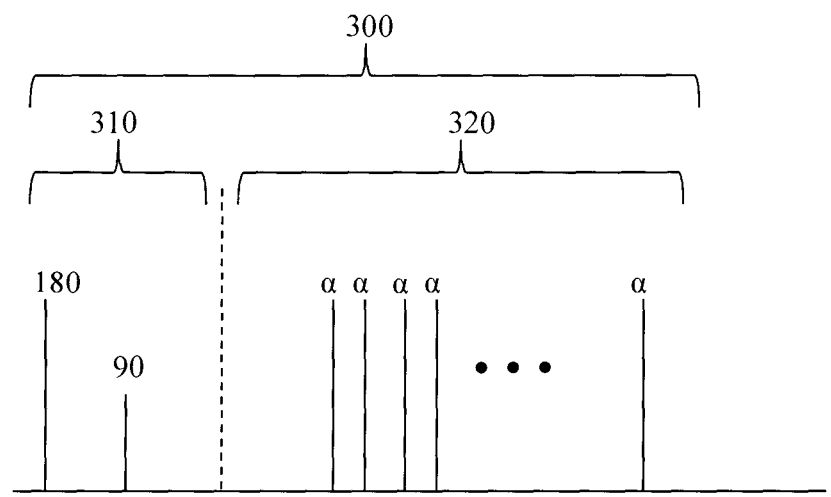
FIG. 3 compares and contrasts conventional sequence blocks to example sequence blocks.
Figure 3:
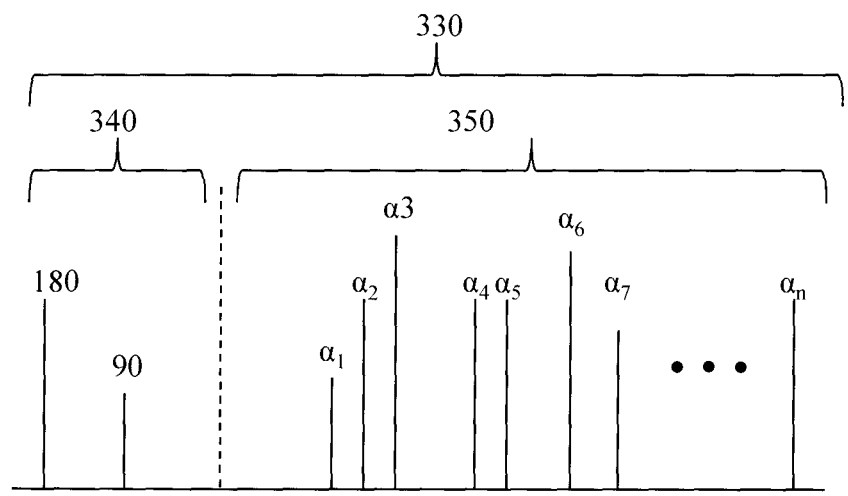

FIG. 3 compares and contrasts conventional MR sequence blocks to MRF sequence blocks. Sequence block 300 includes a preparation phase 310 and an acquisition phase 320. During acquisition phase 320, multiple acquisitions using the same flip angle and the same interval between acquisitions may be performed.

Sequence block 330 also includes a phase 340 and an acquisition phase 350. Notice that acquisition phase 350 is much longer than acquisition phase 320. Unlike acquisition phase 320 where parameters are either fixed or vary linearly, in acquisition phase 350 the parameters may vary widely, either non-linearly, randomly, and/or pseudo-randomly. Parameters that may vary include, but are not limited to, echo time, flip angle, and phase encoding. Note also that while phase 340 may, in some examples, be a preparation phase or preparation-like phase, phase 340 does not necessarily perform a conventional preparation.

Figure 9:
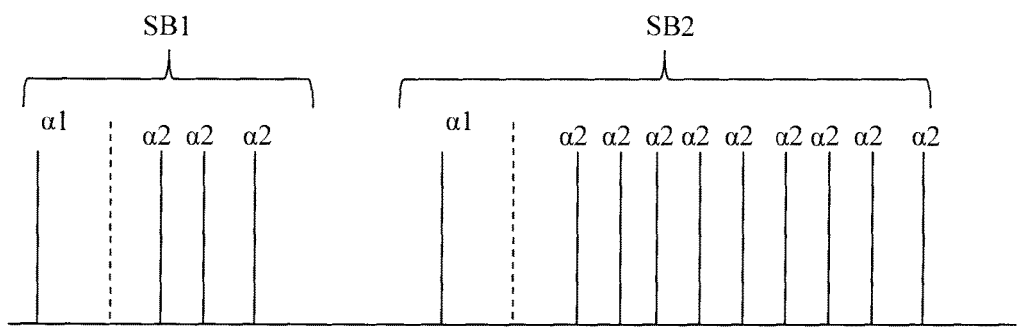
FIG. 9 illustrates another example set of sequence blocks.

FIG. 9 illustrates another example set of sequence blocks. In FIG. 9, a first sequence block SB1 has a first alpha pulse α1 and a series of identical α2 pulses. In FIG. 9, a second sequence block SB2 has the same first alpha pulse α1 and a different series of identical α2 pulses. The phase may be the same for the α2 pulses. Thus, in this example, the only difference between members of the set of sequence blocks is the number of α2 pulses.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 4:
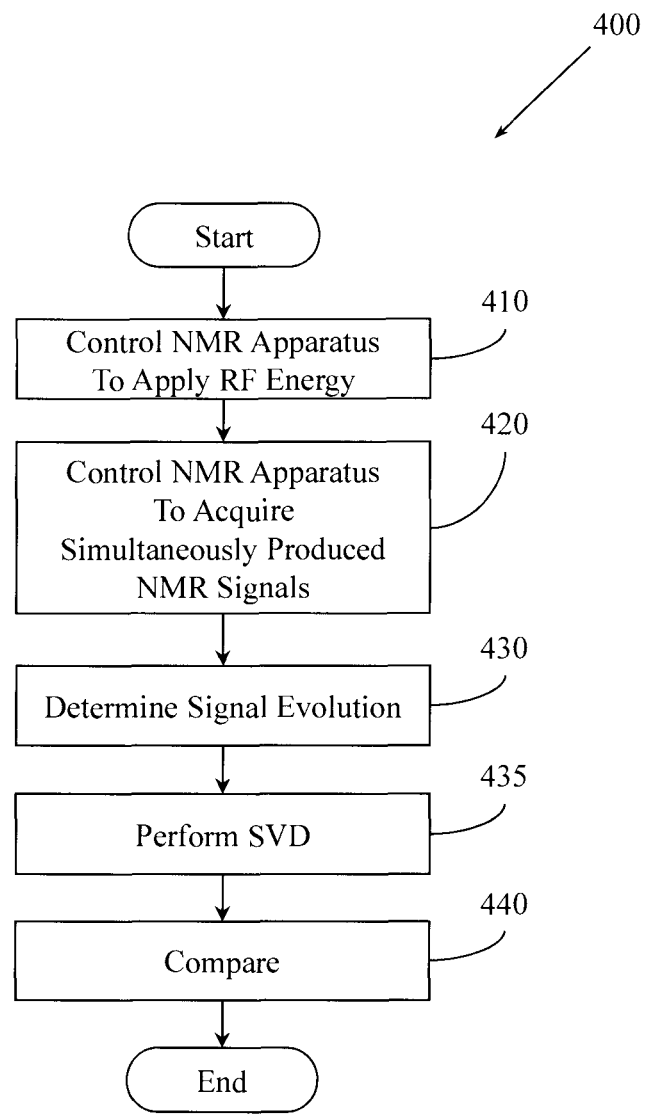
FIG. 4 illustrates an example method associated with NMR fingerprinting.

FIG. 4 illustrates a method 400 associated with NMR fingerprinting with SVD compression. Method 400 includes, at 410, controlling an NMR apparatus to apply RF energy to a volume in an object. The volume may contain one or more resonant species. In one embodiment, the object may be a human and thus resonant species may include, but are not limited to, tissue, fat, water, hydrogen, and prosthetics. The RF energy may be applied in a series of variable sequence blocks. Sequence blocks may vary in a number of parameters including, but not limited to, echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling. In different embodiments two, three, four, or more parameters may vary between sequence blocks. In different embodiments, the number of parameters varied between sequence blocks may itself vary. For example, A1 (sequence block 1) may differ from A2 in five parameters, A2 may differ from A3 in seven parameters, and A3 may differ from A4 in two parameters. There are a nearly infinite number of series of sequence blocks that can be created by varying this large number of parameters. In one embodiment, a series of sequence blocks is crafted so that the series have different amounts (e.g., 1%, 2%, 5%, 10%, 50%, 99%, 100%) of unique sequence blocks as defined by their varied parameters. In different embodiments, a series of sequence blocks may include more than ten, more than one hundred, more than one thousand, more than ten thousand, and more than one hundred thousand sequence blocks. In one example, the only difference between consecutive sequence blocks may be the number of $\alpha 2$ pulses as illustrated in FIG. 9.

The RF energy applied during a sequence block causes different individual resonant species to simultaneously produce individual NMR signals. Unlike conventional MR systems, at least one member of the series of variable sequence blocks will differ from at least one other member of the series of variable sequence blocks in at least N sequence block parameters, N being an integer greater than one. The signal content of a signal evolution may vary directly with N. Thus, as more parameters are varied, a potentially richer signal is retrieved. Richer signals may be compared to signals in a dictionary to identify MR parameters. Example apparatus and methods may perform SVD on the dictionary to reduce the time required to perform the comparing of observed signals to stored signals.

In one embodiment, the NMR apparatus may be controlled at 410 to apply members of the series of variable sequence blocks according to a partially random acquisition plan that under-samples the object at an under-sampling rate R. In different embodiments, rate R may be, for example, two, four, or greater.

Method 400 also includes, at 420, controlling the NMR apparatus to acquire the simultaneously produced individual NMR signals. Unlike conventional systems where the time during which an NMR signal can be acquired is severely limited (e.g., 4-5 seconds), the NMR apparatus can be controlled to acquire NMR signal for significantly longer periods of time. For example, the NMR apparatus can be controlled to acquire signal for up to ten seconds, for up to twenty seconds, for up to one hundred seconds, or longer. NMR signals can be acquired for longer periods of time because signal information content remains viable for longer periods of time in response to the series of varied RF energy applied at 410. In different embodiments, the information content in the signal evolution may remain above an information content threshold for at least five seconds, for at least ten seconds, for at least sixty seconds, or for longer. An information content threshold may describe, for example, the degree to which a subsequent signal acquisition includes information that can be retrieved and that differs from information acquired in a previous signal acquisition. For example, a signal that has no retrievable information would likely fall below an information content threshold while a signal with retrievable information that differs from information retrieved from a previous signal would likely be above the information content threshold.

Method 400 also includes, at 430, controlling the NMR apparatus to determine a signal evolution from the acquired NMR signals. Determining the signal evolution may include storing (k, t, E) space data points acquired during action 420. While an individual sequence block may yield a single point in (k, t, E) space, the signal evolution is determined by the series of variable sequence blocks. Over time, series of variable sequence blocks that yield particularly useful signal evolutions may be identified.

In one embodiment, the simultaneously produced signals are acquired at 420 over a first period of time and the signal evolution is determined at 430 over a second period of time. In different embodiments the first period of time may be ten seconds or longer, sixty seconds or longer, and even longer.

Additionally, in different embodiments, the second period of time may be ten seconds or longer, sixty seconds or longer, and even longer.

Method 400 also includes, at 440, controlling the NMR apparatus to compare first information (e.g., observed signal evolution) to reference information (e.g., MRF dictionary entries). Example apparatus and methods may perform SVD on the reference information and/or the first information at 435. The first information may be, for example, the signal evolution. The reference information may be, for example, known, stored, simulated, and/or predicted signal evolutions. The reference information may also include information that is produced as a function of a known, stored, simulated, or predicted signal evolution. The reference information may be produced by, for example, transforming a signal evolution, combing signal evolutions, decomposing signal evolutions, and other operations. In different examples, the "stored" signal evolutions may include previously acquired signals, simulated signals, or both. In one embodiment, the stored signal evolutions are associated with signals not acquired from the object while in another embodiment the stored signal evolutions are associated with signals acquired from the object. In one embodiment, the stored signals may be associated with signals acquired from the object being analyzed and signals not acquired from the object being analyzed.

The stored signals and information derived from reference signal evolutions may be associated with a potentially very large data space. The stored signal evolutions and information derived from reference signal evolutions may include signals outside the set of signal evolutions characterized by:

$$SE = A - Be^{-t/C}$$

where:
SE is a signal evolution,
A is a constant,
B is a constant,
t is time, and
C is a single relaxation parameter.

The very large data space for signal evolutions can be partially described by:

$$SE = \sum_{s=1}^{N_S} \prod_{i=1}^{N_A} \sum_{j=1}^{N_{RF}} R_i(\alpha) R_{RF_{ij}}(\alpha, \varphi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
$\alpha$ is a flip angle,
$\varphi$ is a phase angle,
$R_i(\alpha)$ is a rotation due to off resonance,
$R_{RF_{ij}}(\alpha,\varphi)$ is a rotation due to RF differences,
$R(G)$ is a rotation due to a gradient,
T1 is spin-lattice relaxation,
T2 is spin-spin relaxation,
D is diffusion relaxation,
$E_i(T1,T2,D)$ is associated with magnetization changes, and
$M_0$ is the default or natural alignment to which spins align when placed in the main magnetic field.

While $E_i(T1,T2,D)$ is provided as an example, in different embodiments, $E_i(T1,T2,D)$ may actually be $E_i(T1,T2,D, \ldots)$, or $E_i(T1,T2, \ldots)$.

In one example, the summation on j could be replaced by a product on j, e.g.:

$$SE = \sum_{s=1}^{N_S} \prod_{i=1}^{N_A} \sum_{j=1}^{N_{RF}} R_i(\alpha) R_{RF_{ij}}(\alpha, \varphi) R(G) E_i(T1, T2, D) M_0$$

In one embodiment, the dictionary may store signals described by $$S_i = R_i E_i (S_{i-1}),$$

where:
$S_0$ is the default or equilibrium magnetization.
$S_i$ is a vector that represents the different components of the magnetization Mx, My, Mz during acquisition block i,
$R_i$ is the combination of rotational effects that occur during acquisition block i, and
$E_i$ is the combination of effects that alter the amount of magnetization in the different states for acquisition block i. In this embodiment, the signal at acquisition block i is a function of the previous signal at acquisition block i–1.

In another embodiment, the dictionary may store signals described by:

$$S_i = R_i E_i \sum_{x=1}^{i-1} R_x E_x (S_x)$$

In this embodiment, the signal is a function of the current relaxation and rotation effects and of previous acquisitions.

In another embodiment, the dictionary may store signals described by:

$$S_i = \sum_{s=1}^{N_S} R_{s,i} E_{s,i} (S_{s,i-1})$$

In this embodiment, voxels have multiple resonant species or spins, and the effects may be different for every spin within a voxel.

In another embodiment, the dictionary may store signals described by:

$$S_i = \sum_{s=1}^{N_S} R_{s,i} E_{s,i} \sum_{x=1}^{i-1} R_{s,x} E_{s,x} (S_{s,x})$$

In this embodiment, voxels may have multiple resonant species or spins, and the effects may be different for spins within a voxel, and thus the signal may be a function of the effects and the previous acquisition blocks. Example apparatus and methods may perform SVD on the signals stored in the dictionary to reduce the rank of the dictionary, which in turn reduces the processing time for matching. Example apparatus and methods may also perform SVD on an acquired signal and then perform pattern matching in the lower rank SVD space.

In NMR, MRI, or ESR (electron spin resonance), a Bloch equation is a member of a set of macroscopic equations that are used to calculate the nuclear magnetization $M=(M_x, M_y, M_z)$ as a function of time when relaxation times $T_1$ and $T_2$ are present. These phenomenological equations were introduced by Felix Bloch and may also be referred to as the equations of motion of nuclear magnetization. In one embodiment Ri($\alpha$), $R_{RFij}(\alpha,\phi)$, and R(G) may be viewed as Bloch equations.

While FIG. 4 illustrates various actions occurring in serial, it is to be appreciated that various actions illustrated in FIG. 4 could occur substantially in parallel. By way of illustration, a first process could control applying RF energy, a second process could control acquiring NMR signals and determining a signal evolution, a third process could perform SVD on a set of stored signals (e.g., a dictionary), and a fourth process could perform comparisons. While four processes are described, it is to be appreciated that a greater and/or lesser number of processes could be employed.

Figure 5:
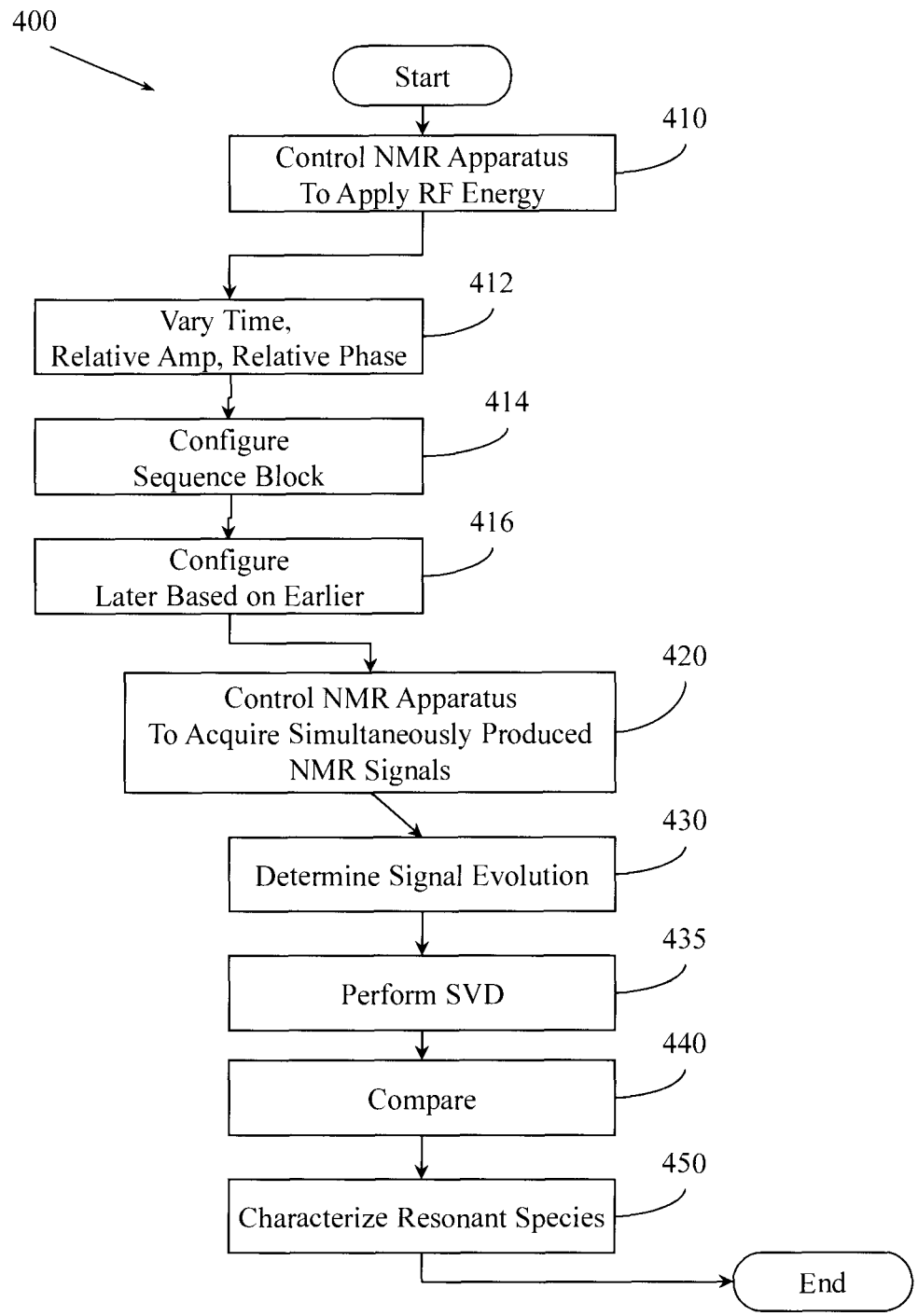
FIG. 5 illustrates an example method associated with NMR fingerprinting.

FIG. 5 illustrates another embodiment of method 400 (FIG. 4). This embodiment includes actions 410, 420, 430, 435, and 440. However, this embodiment also includes actions 412, 414, 416, and 450. This embodiment of method 400 includes, at 412, controlling the NMR apparatus to vary one or more of, the amount of time between sequence blocks, the relative amplitude of sequence blocks, and the relative phase of sequence blocks. Thus, not only can the individual parameters (e.g., flip angle, phase) be varied between sequence blocks, but the times between sequence blocks and other differences between sequence blocks can be varied. This facilitates creating additional signal content in the signal evolution. Additional signal content in the signal evolution may produce a more complicated signal evolution to be compared against the dictionary. Thus, in addition to performing SVD on the dictionary to produce the lower dimensional SVD space $C^k$, the observed signal evolution may also be projected on the lower dimensional SVD space $C^k$ and then template matching may be performed in the SVD space $C^k$. Performing the template matching in the lower dimensional SVD space $C^k$ may take less time than performing full template matching.

This embodiment of method 400 also includes, at 414, controlling the NMR apparatus to configure a member of the series of variable sequence blocks as one of, a TrueFISP pulse sequence, a FLASH pulse sequence, and a TSE pulse sequence. Action 414 illustrates that a set of MRF sequence blocks is not necessarily the same thing as a conventional MR pulse sequence. An MRF sequence block differs from a conventional pulse sequence for at least the reason that non-linearly varying $\Delta t$ and $\Delta E$, which produce NMR signals in (k, t, E) space having non-constant amplitudes and phases are encouraged, not prohibited.

This embodiment of method 400 also includes, at 416, controlling the NMR apparatus to configure a later member of the series of variable sequence blocks based, at least in part, on an NMR signal acquired in response to applying an earlier member of the series of variable sequence blocks. Thus, this embodiment of method 400 is an adaptive method where the order of members of the series of varied sequence blocks may not be known ahead of time. Instead, as data points in (k, t, E) space are acquired, and as a signal evolves, decisions concerning different sequence blocks and different sets of parameters to vary may be made. By way of illustration, a first number of data points in (k, t, E) space and an evolving signal may be leading towards one relaxation parameter determination and away from another relaxation parameter determination. Therefore, sequence blocks that can confirm and/or reject either of these leads may be applied next in the series to facilitate a guided and more rapid convergence in the pattern matching process.

This embodiment of method 400 also includes, at 450, controlling the NMR apparatus to characterize at least one of the resonant species. In one embodiment, the characterizing may be a function of comparing the signal evolution to one or more stored (e.g., known, simulated, predicted) signal evolutions. Comparing the acquired signal evolution to a stored signal evolution may include, for example, controlling the NMR apparatus to compare the signal evolution to members of a multi-dimensional set of NMR signal evolutions. A first dimension in the multi-dimensional set may be associated with a first set of sequence block parameters and a second dimension in the multi-dimensional set may be associated with a second, different set of sequence block parameters. Since a signal evolution evolves over time, the multi-dimensional set may include a time dimension and the pattern matching process may include a path matching process that monitors the progress of the signal evolution. Additionally, since one series of varied sequence blocks may differ from another series of varied sequence blocks, the multi-dimensional set may include an order dimension where once again the pattern matching process may path match as opposed to just pattern matching.

Characterizing a resonant species may include, for example, identifying relaxation parameters including, but not limited to, T1 relaxation associated with the resonant species, T2 relaxation associated with the resonant species, off-resonance relaxation associated with the resonant species, and diffusion weighted relaxation associated with the resonant species. Characterizing a resonant species may also include, for example, identifying properties that are not relaxation parameters including, but not limited to, diffusion coefficients, spin density, proton density, magnetic field strength, gradient field strength, tissue type, and material type.

Figure 6:
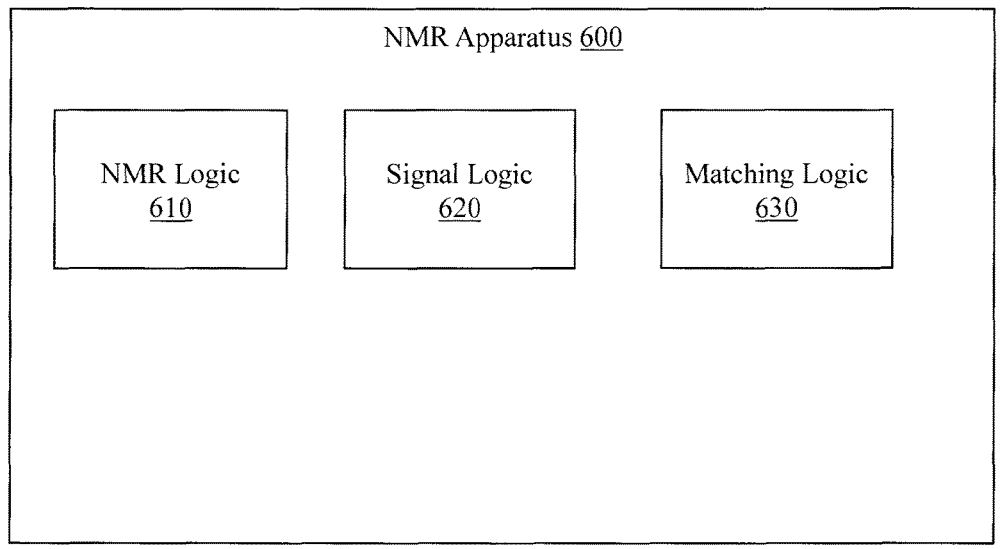
FIG. 6 illustrates an example apparatus associated with NMR fingerprinting.

FIG. 6 illustrates an NMR apparatus 600. NMR apparatus 600 includes an NMR logic 610. NMR logic 610 repetitively and variably samples an object in a (k, t, E) space to acquire a set of NMR signals that may have non-constant amplitude and/or phase. Members of the set of NMR signals are associated with different points in the (k, t, E) space. In different embodiments the different points are sampled according to a plan where t and/or E varies non-linearly and/or in a non-constant manner.

NMR apparatus 600 also includes a signal logic 620. Signal logic 620 produces an NMR signal evolution from the NMR signals. The signal evolution may include a number of NMR signals acquired over a period of time.

NMR apparatus 600 also includes a matching logic 630. Matching logic 630 compares the produced NMR signal evolution or information associated with the produced NMR signal evolution to reference information. The reference information may be, for example, a previously acquired signal evolution, a simulated signal evolution, an item derived from a signal evolution other than the produced NMR signal evolution, and other information. Before comparing the produced NMR signal evolution to the reference information, matching logic 630 may project the reference information onto a subspace spanned by the first k singular vectors in an MRF dictionary to produce a representation of the dictionary entries into a lower dimensional SVD space $C^k$. In one embodiment, SVD space $C^k$ may be less than 25% of the size of the dictionary. In another embodiment, SVD space $C^k$ may be less than 10% of the size of the dictionary. Matching logic 630 may then project the produced NMR signal evolution onto the lower dimensioned SVD space $C^k$. Matching logic 630 may then perform the matching between the produced NMR signal evolution and the reference information in $C^k$.

Figure 7:
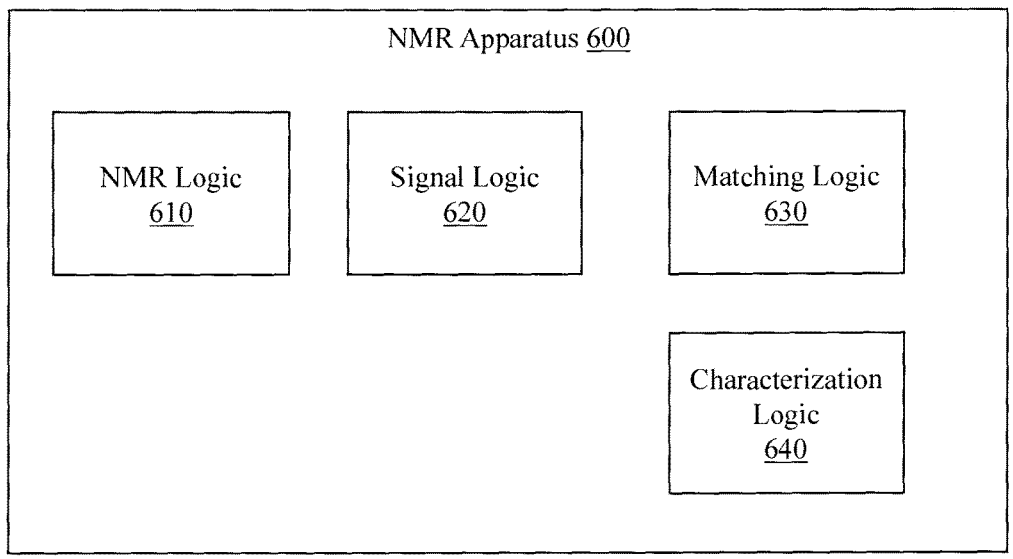
FIG. 7 illustrates an example apparatus associated with NMR fingerprinting.

FIG. 7 illustrates another embodiment of apparatus 600 (FIG. 6). This embodiment of apparatus 600 includes a characterization logic 640. Characterization logic 640 characterizes a resonant species in the object. Characterizing the resonant species may include identifying relaxation parameters including, but not limited to, T1 relaxation, T2 relaxation, diffusion weighted relaxation, and off-resonance relaxation. Characterizing the resonant species may also include identifying non-relaxation parameters including, but not limited to, diffusion co-efficient, spin density, proton density, tissue type, and material type. In one embodiment, the relaxation or non-relaxation parameters may be stored in the dictionary and retrieved by relation to a matched dictionary entry. In another embodiment, the relaxation or non-relaxation parameters may be stored outside the dictionary and retrieved by relation to a matched dictionary entry While matching logic 630 (FIG. 6) and characterization logic 640 (FIG. 7) are illustrated as being part of NMR apparatus 600, in one embodiment, the matching logic 630 and/or the characterization logic 640 may reside in an apparatus separate from the NMR apparatus 600. In this embodiment, NMR apparatus 600 may provide NMR signals to the separate apparatus housing matching logic 630 and characterization logic 640. In one embodiment, matching logic 630 and characterization logic 640 may reside in separate apparatus.

Figure 8:
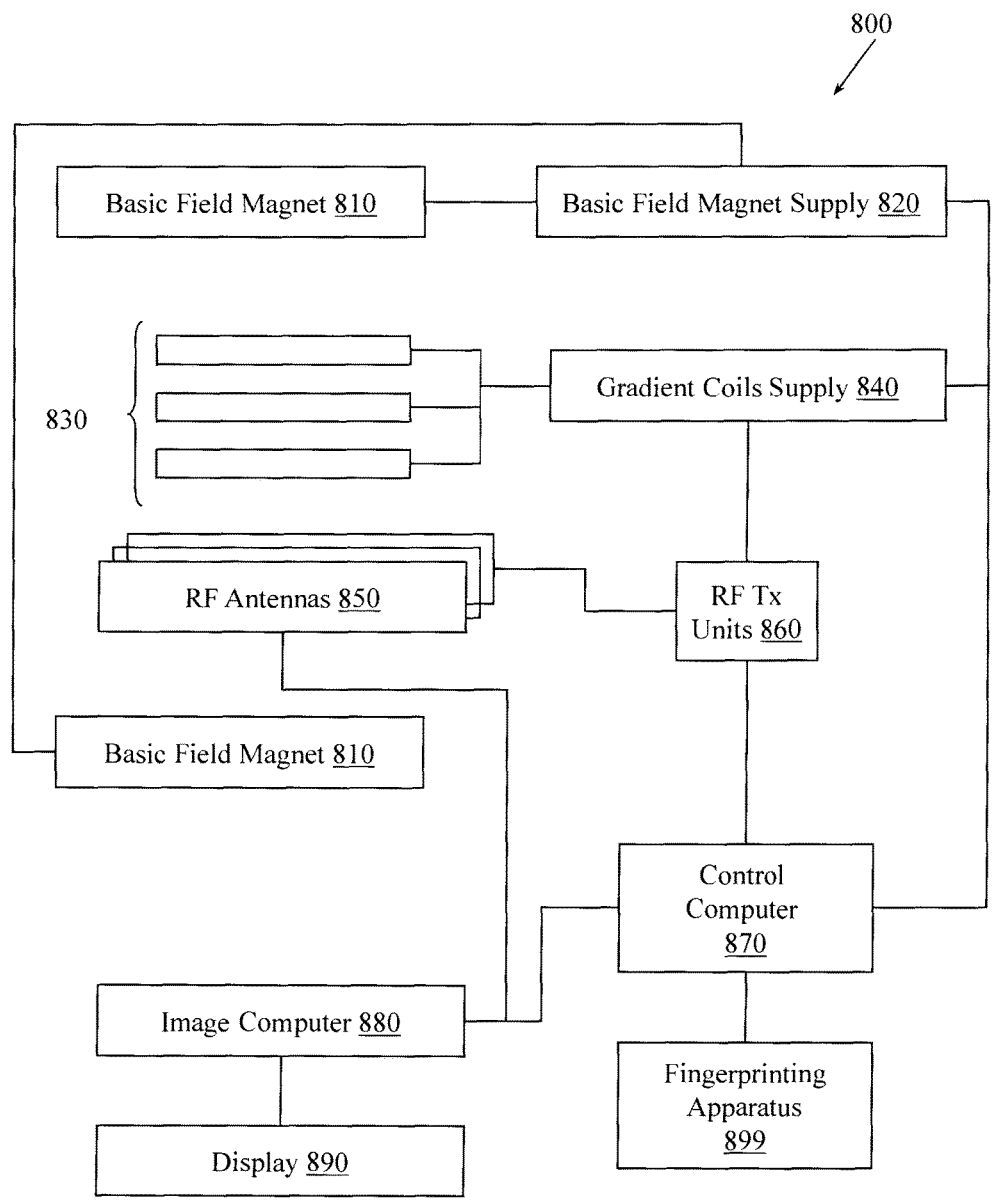
FIG. 8 illustrates an MR apparatus configured to perform NMR fingerprinting.

FIG. 8 illustrates an example MR apparatus 800 configured with a fingerprinting apparatus 899 to facilitate MR fingerprinting. The fingerprinting apparatus 899 may be configured with elements of example apparatus described herein and/or may perform example methods described herein. While fingerprinting apparatus 899 is illustrated as part of MR apparatus 800, in one example, fingerprinting apparatus 899 may be a separate apparatus or apparatuses.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being analyzed by the MR apparatus 800. MR apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted, during an MR procedure.

MR apparatus 800 may include a set of RF antennas 850 that generate RF pulses and to receive resulting nuclear magnetic resonance signals from an object to which the RF pulses are directed. In some examples, how the pulses are generated and how the resulting MR signals are received may be controlled and thus may be selectively adapted during an MR procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control an NMR device as described herein. Conventionally, the magnetic resonance signals received from the RF antennas 850 can be employed to generate an image and thus may be subject to a transformation process like a two dimensional FFT that generates pixilated image data. The transformation can be performed by an image computer 880 or other similar processing device. The image data may then be shown on a display 890.

However, fingerprinting apparatus 899 facilitates not having to do conventional reconstruction of an image from MR signals received from the RF antennas 850. Thus the RF energy applied to an object by apparatus 800 need not be constrained to produce signals with substantially constant amplitudes or phases. Instead, fingerprinting apparatus 899 facilitates matching received signals to known signals for which a reconstruction, relaxation parameter, or other information is already available. The known signals and the received signals may be processed by SVD before matching to reduce processing in the time domain.

While FIG. 8 illustrates an example MR apparatus 800 that includes various components connected in various ways, it is to be appreciated that other MR apparatus may include other components connected in other ways. In one embodiment, characterizing the object includes providing information concerning items including, but not limited to, T1 associated with the object, T2 associated with the object, a diffusion coefficient associated with the object, a spin density associated with the object, a proton density associated with the object, a magnetic field to which the object was exposed, a gradient field to which the object was exposed, a tissue type of the object, and an identification of the object.

In one embodiment, characterizing the object may include performing actions including, but not limited to, identifying a portion of the reference set of data related to the first set of data, identifying a degree to which a portion of the reference set of data is related to the first set of data, and identifying the likelihood that a portion of the reference set of data is related to the first set of data.

In one embodiment, the first set of data may have data including, but not limited to, the NMR signals acquired from the object in response to the NMR fingerprinting excitation, a signal evolution produced from the NMR signals acquired from the object in response to the NMR fingerprinting excitation, and information derived from the signal evolution produced from the NMR signals acquired from the object in response to the NMR fingerprinting excitation. The information derived from the signal evolution may include, for example, information derived by transforming the signal evolution, information derived by combining the signal evolution with one or more other signal evolutions, and information derived by decomposing the signal evolution. SVD may be applied to the first set of data.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one of, A, B, and C" is employed herein, (e.g., a data store configured to store one of, A, B, and C) it is intended to convey the set of possibilities A, B, and C, (e.g., the data store may store only A, only B, or only C). It is not intended to require one of A, one of B, and one of C. When the applicants intend to indicate "at least one of A, at least one of B, and at least one of C", then the phrasing "at least one of A, at least one of B, and at least one of C" will be employed.

To the extent that the phrase "one or more of, A, B, and C" is employed herein, (e.g., a data store configured to store one or more of, A, B, and C) it is intended to convey the set of possibilities A, B, C, AB, AC, BC, ABC, AA . . . A, BB . . . B, CC . . . C, AA . . . ABB . . . B, AA . . . ACC . . . C, BB . . . BCC . . . C, or AA . . . ABB . . . BCC . . . C (e.g., the data store may store only A, only B, only C, A&B, A&C, B&C, A&B&C, or other combinations thereof including multiple instances of A, B, or C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A method, comprising:
accessing a set of known signal evolutions, where the set of known signal evolutions have a first rank;
compressing members of the set of known signal evolutions into a set of compressed signal evolutions using singular value decomposition (SVD) basis compression, where members of the compressed signal evolutions have a lower rank than the first rank;
accessing an acquired nuclear magnetic resonance (NMR) signals, where the acquired NMR signals is acquired from a volume that contains one or more resonant species that simultaneously produced individual NMR signals in response to the application of magnetic resonance fingerprinting (MRF) radio frequency (RF) energy;
comparing the acquired NMR signals to members of the set of compressed signal evolutions to identify a matching compressed signal evolution, and
characterizing a resonant species in the volume as a function of the matching compressed signal evolution, where characterizing the resonant species comprises identifying one or more of, T1 relaxation associated with the resonant species, T2 relaxation associated with the resonant species, off-resonance relaxation associated with the resonant species, and diffusion weighted relaxation associated with the resonant species.

2. The method of claim 1, comprising compressing the acquired NMR signals using the SVD compression to produce a compressed NMR signals and comparing the compressed NMR signals to members of the set of compressed signal evolutions.

3. The method of claim 1, comprising:
controlling an NMR apparatus to apply the MRF RF energy to the volume in an object in a series of variable sequence blocks, where a sequence block includes one or more excitation phases, one or more readout phases, and one or more waiting phases,
where the MRF RF energy applied during a sequence block is configured to cause the one or more resonant species in the volume to simultaneously produce individual NMR signals, and
where at least one member of the series of variable sequence blocks differs from at least one other member of the series of variable sequence blocks in at least N sequence block parameters, N being an integer greater than one, and
controlling the NMR apparatus to acquire the simultaneously produced individual NMR signals as the acquired NMR signals.

4. The method of claim 2,
where compressing members of the set of known signal evolutions into the set of compressed signal evolutions using SVD basis compression includes producing a projected dictionary $D_k$ by projecting an MRF dictionary D onto an SVD spanned by the vectors $\{v_1, \ldots, v_k\}$ according to:

$$D_k = DV_k,$$

where k is the number of vectors and V a kth singular vector;
where compressing the acquired NMR signals into the compressed NMR signals using the SVD compression includes producing a projected signal $x_k$ by projecting a normalized signal evolution x produced from the acquired NMR signal onto an SVD space $C^k$ according to:

$$x_k = xV_k$$

and
where comparing the compressed NMR signals to members of the set of compressed signal evolutions includes performing matching in $C^k$ using the projected signal $x_k$ and the projected dictionary $D_k$ to find a selected entry that satisfies $$\max_{1 \leq j \leq n} |(d_j V_k) x_k^*|$$

where d is an entry that is varied by an incremented variable from j=1, . . . , n, and wherein $x_k^*$ is a conjugate transpose of the projected signal $x_k$.

5. The method of claim 4, where characterizing the resonant species in the volume includes recovering an MR parameter by correlating the selected entry to the MR parameter.

6. The method of claim 5, where the MR parameter is T1 associated with the material, T2 associated with the material, a diffusion coefficient associated with the material, a spin density associated with the material, a proton density associated with the material, a magnetic field to which the material was exposed, a gradient field to which material was exposed, a tissue type of the material, or an identification of the material, T1 being spin-lattice relaxation, T2 being spin-spin relaxation.

7. The method of claim 6, where the sequence block parameters comprise echo time, flip angle, phase encoding, diffusion encoding, flow encoding, RF pulse amplitude, RF pulse phase, number of RF pulses, type of gradient applied between an excitation portion of a sequence block and a readout portion of a sequence block, number of gradients applied between an excitation portion of a sequence block and a readout portion of a sequence block, type of gradient applied between a readout portion of a sequence block and an excitation portion of a sequence block, number of gradients applied between a readout portion of a sequence block and an excitation portion of a sequence block, type of gradient applied during a readout portion of a sequence block, number of gradients applied during a readout portion of a sequence block, amount of RF spoiling, and amount of gradient spoiling.

8. The method of claim 7, comprising:
controlling the NMR apparatus to vary one or more of, an amount of time between sequence blocks in the series of variable sequence blocks, a relative amplitude of RF pulses in sequence blocks in the series of variable sequence blocks, and a relative phase of RF pulses in sequence blocks in the series of variable sequence blocks.

9. The method of claim 8, where the MRF dictionary includes signal evolutions outside the set of signal evolutions characterized by:

$$SE = A - Be^{-t/C}$$

where:
SE is a signal evolution,
A is a constant,
B is a constant,
t is time, and
C is a single relaxation parameter.

10. The method of claim 1, where the set of known signal evolutions include a signal selected from a set of signals described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
$\alpha$ is a flip angle,
$\phi$ is a phase angle,
$Ri(\alpha)$ is a rotation due to off resonance,
$R_{RFij}(\alpha,\phi)$ is a rotation due to RF differences,
$R(G)$ is a rotation due to a gradient,
T1 is spin-lattice relaxation,
T2 is spin-spin relaxation,
D is diffusion relaxation,
$E_i(T1,T2,D)$ is decay due to relaxation differences, and
$M_0$ is the default to which spins align when placed in the main magnetic field.

11. The method of claim 1, where the set of known signal evolutions include a signal selected from a set of signals described by:

$$SE = \sum_{s=1}^{N_S} \prod_{i=1}^{N_A} \sum_{j=1}^{N_{RF}} R_i(\alpha) R_{RF_{ij}}(\alpha, \phi) R(G) E_i(T1, T2, D) M_0$$

where:
SE is a signal evolution,
$N_S$ is a number of spins,
$N_A$ is a number of sequence blocks,
$N_{RF}$ is a number of RF pulses in a sequence block,
$\alpha$ is a flip angle,
$\phi$ is a phase angle,
$Ri(\alpha)$ is a rotation due to off resonance,
$R_{RFij}(\alpha,\phi)$ is a rotation due to RF differences,
$R(G)$ is a rotation due to a gradient,
T1 is spin-lattice relaxation,
T2 is spin-spin relaxation,
$E_i(T1,T2,\ldots)$ is decay due to relaxation differences, and
$M_0$ is the default to which spins align when placed in the main magnetic field.

12. The method of claim 1, where the set of known signal evolutions include a signal selected from a set of signals described by:

$$S_i = R_i E_i (S_{i-1})$$

where:
$S_0$ is the default or equilibrium magnetization,
$S_i$ is a vector that represents the different components of the magnetization Mx, My, Mz during acquisition block i, $R_i$ is the combination of rotational effects that occur during acquisition block i, and $E_i$ is the combination of effects that alter the amount of magnetization in the different states for acquisition block i.

13. The method of claim 1, where the set of known signal evolutions include a signal selected from a set of signals described by:

$$S_i = R_i E_i \sum_{x=1}^{i-1} R_x E_x (S_x)$$

where:
$S_0$ is the default or equilibrium magnetization,
$S_i$ is a vector that represents the different components of the magnetization Mx, My, Mz during acquisition block i,
$R_i$ is the combination of rotational effects that occur during acquisition block i,
$E_i$ is the combination of effects that alter the amount of magnetization in the different states for acquisition block i, and
$R_x$ is the combination of rotational effects that occur during acquisition block x,
$E_x$ is the combination of effects that alter the amount of magnetization in the different states for acquisition block x, and
$S_x$ is a vector that represents the different components of the magnetization Mx, My, Mz during acquisition block x.

14. The method of claim 1, where the set of known signal evolutions include a signal selected from a set of signals described by:

$$S_i = \sum_{s=1}^{N_s} R_{s,i} E_{s,i} (S_{s,i-1})$$

where:
$S_0$ is the default or equilibrium magnetization,
Ns is the number of spins,
$S_i$ is a vector that represents the different components of the magnetization Mx, My, Mz during acquisition block i,
$S_{i,i-1}$ is a vector that represents the different components of the magnetization Mx, My, Mz during acquisition block i-1,
$R_{s,i}$ is the combination of rotational effects that occur during acquisition block i, and $E_{s,i}$ is the combination of effects that alter the amount of magnetization in the different states for acquisition block i.

15. The method of claim 1, where the set of known signal evolutions include a signal selected from a set of signals described by:

$$S_i = \sum_{s=1}^{N_s} R_{s,i} E_{s,i} \sum_{x=1}^{i-1} R_{s,x} E_{s,x} (S_{s,x})$$

where:
$S_0$ is the default or equilibrium magnetization,
$N_s$ is the number of spins,
$S_i$ is a vector that represents the different components of the magnetization Mx, My, Mz during acquisition block i,
$R_{s,i}$ is the combination of rotational effects that occur during acquisition block i,
$E_{s,i}$ is the combination of effects that alter the amount of magnetization in the different states for acquisition block i,
$R_{s,x}$ is the combination of rotational effects that occur during an acquisition block x,
$E_{s,x}$ is the combination of effects that alter the amount of magnetization in the different states for acquisition block x; and
$S_{s,x}$ is a vector that represents the different components of the magnetization Mx, My, Mz during acquisition block x.

16. The method of claim 4, comprising projecting raw k-space data prior to performing image reconstruction, and producing k singular images, where k is less than a number of time points associated with the raw k-space data.

17. The method of claim 16, comprising applying an inverse Fourier transform to the projected data.

18. An apparatus, comprising:
an NMR logic that receives a first set of data from an NMR apparatus that repetitively and variably samples a (k, t, E) space associated with an object to acquire a set of NMR signals, where members of the first set of data are associated with different points in the (k, t, E) space, where t is time and E includes at least one of, T1 and T2, T1 being spin-lattice relaxation, and T2 being spin-spin relaxation, and where one or more of, t, and E, vary non-linearly;
a signal logic that produces an NMR signal evolution from the first set of data, and
a matching logic that produces a comparison of the NMR signal evolution and a stored signal evolution, where the stored signal evolution has been reduced from a first higher rank to a second lower rank through singular value decomposition (SVD).

19. The apparatus of claim 18, comprising a characterization logic that characterizes the object based, at least in part, on the comparison.

20. The apparatus of claim 19, where the matching logic reduces the NMR signal evolution using SVD before producing the comparison.

21. The apparatus of claim 20, where the SVD includes: projecting the stored signal evolution onto a subspace spanned by a first k singular vectors in a magnetic resonance fingerprinting (MRF) dictionary of stored signal evolutions to produce a representation of dictionary entries into a lower dimensional SVD space $C^k$.

22. The apparatus of claim 21, where reducing the NMR signal evolution using SVD includes projecting the NMR signal evolution onto the lower dimensioned SVD space $C^k$.

23. The apparatus of claim 22, where the comparison is performed in the lower dimensioned SVD space $C^k$.

24. The apparatus of claim 23, where the SVD space $C^k$ is less than 25% of the size of the dictionary.

25. The apparatus of claim 23, where the SVD space $C^k$ is less than 10% of the size of the dictionary.

26. The apparatus of claim 19, where the characterization logic provides image pixel data suitable for producing a diagnostic image, where the image pixel data is identified from the comparison.

27. The apparatus of claim 19, where the characterization logic provides diagnostic information, where the diagnostic information is identified from the comparison.

28. The apparatus of claim 19, where the (k, t, E) space is produced as a function of applying RF energy to the object according to two or more different sequence blocks, where a sequence block includes one or more excitation phases, one or more readout phases, and one or more waiting phases, where at least one member of the two or more sequence blocks differs from at least one other member of the two or more sequence blocks in at least one of, the number of α2 pulses in a sequence block, the spacing of α2 pulses in a sequence block, the phase of α2 pulses in a sequence block, and the amplitude of α2 pulses in a sequence block.

29. The apparatus of claim 19, where the characterization logic provides information concerning T1 associated with the object, T2 associated with the object, a diffusion coefficient associated with the object, a spin density associated with the object, a proton density associated with the object, a magnetic field to which the object was exposed, a gradient field to which the object was exposed, a tissue type of the object, or an identification of the object.

30. A magnetic resonance imaging (MRI) apparatus, comprising:
a data store that stores a dictionary of magnetic resonance fingerprinting (MRF) signal evolutions;
a collection logic that collects a received signal evolution from an object exhibiting nuclear magnetic resonance (NMR) in response to an MRF pulse sequence applied by the MRI apparatus;
a first singular value decomposition logic that produces a subset of MRF signal evolutions from the dictionary of MRF signal evolutions, where MRF signal evolutions in the subset have a lower rank than MRF signal evolutions in the signal dictionary;
a second singular value decomposition logic that produces a temporary signal evolution from the received signal evolution, where the temporary signal evolution has a lower rank than the received signal evolution;
a selection logic that selects a member of the subset for which a comparison value is maximized when the member is compared to the temporary signal evolution, and
a characterization logic that identifies, from the member, an MR parameter associated with the object.

* * * * *